(12) United States Patent
Kitazume et al.

(10) Patent No.: US 12,308,161 B2
(45) Date of Patent: May 20, 2025

(54) MODULE

(71) Applicant: Murata Manufacturing Co., Ltd., Nagaokakyo (JP)

(72) Inventors: Takahiro Kitazume, Nagaokakyo (JP); Daisuke Miyazaki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 826 days.

(21) Appl. No.: 17/478,554

(22) Filed: Sep. 17, 2021

(65) Prior Publication Data

US 2022/0005644 A1    Jan. 6, 2022

Related U.S. Application Data

(63) Continuation of application No. PCT/JP2020/013022, filed on Mar. 24, 2020.

(30) Foreign Application Priority Data

Mar. 26, 2019    (JP) .................. 2019-058198

(51) Int. Cl.
*H01F 27/36* (2006.01)
*H01F 27/32* (2006.01)
*H01F 27/34* (2006.01)

(52) U.S. Cl.
CPC ......... *H01F 27/363* (2020.08); *H01F 27/327* (2013.01); *H01F 2027/348* (2013.01)

(58) Field of Classification Search
CPC .............. H01F 27/363; H01F 27/327; H01F 2027/348; H01F 2017/0053;
(Continued)

(56) References Cited

U.S. PATENT DOCUMENTS

| 2002/0057174 A1* | 5/2002 | Uchikoba | H01F 41/041 336/200 |
| 2005/0174208 A1* | 8/2005 | Sato | H01F 5/00 336/200 |

(Continued)

FOREIGN PATENT DOCUMENTS

| JP | H05299962 A | 11/1993 |
| JP | 2006005297 A | 1/2006 |

(Continued)

OTHER PUBLICATIONS

International Search Report issued for PCT/JP2020/013022, dated Jun. 23, 2020.

(Continued)

*Primary Examiner* — Mang Tin Bik Lian
(74) *Attorney, Agent, or Firm* — ArentFox Schiff LLP

(57) ABSTRACT

A module is provided with a substrate having a main surface, and each of one or more inductors that are disposed on the main surface of the substrate. A resin sealing portion seals the one or more inductors and covers the main surface of the substrate. A ground conductor is disposed on an outer peripheral side of the substrate with respect to entirety of the one or more inductors in a plan view. A plurality of linear conductors are disposed on the resin sealing portion. The plurality of linear conductors are disposed with gaps therebetween, such that the one or more inductors underlie at least one of the plurality of linear conductors in the plan view.

15 Claims, 22 Drawing Sheets

(58) Field of Classification Search
CPC ........... H01F 2017/008; H01F 17/0006; H01F 27/263; H01L 23/00; H01L 23/28; H01L 25/00

See application file for complete search history.

(56) References Cited

U.S. PATENT DOCUMENTS

| | | | | |
|---|---|---|---|---|
| 2011/0175688 A1* | 7/2011 | Omura | ................. | H03H 9/0576 333/133 |
| 2011/0298111 A1* | 12/2011 | Kim | ...................... | H01L 21/561 257/E23.114 |
| 2013/0020119 A1* | 1/2013 | Yoshida | ............... | H05K 1/0218 174/260 |
| 2013/0155639 A1* | 6/2013 | Ogawa | .................... | H01L 25/16 29/841 |
| 2013/0181535 A1* | 7/2013 | Muratov | ............... | H01F 27/363 307/104 |
| 2015/0351243 A1* | 12/2015 | Toda | ...................... | H03H 7/075 361/748 |
| 2017/0256474 A1* | 9/2017 | Fujinaga | ............. | H01L 23/3121 |
| 2017/0323838 A1* | 11/2017 | Otsubo | .................... | H01L 23/52 |
| 2018/0166206 A1* | 6/2018 | Ueyama | ............... | H01F 17/0013 |
| 2018/0166210 A1* | 6/2018 | Araki | ....................... | H01F 27/28 |
| 2018/0286816 A1* | 10/2018 | Kitazaki | .............. | H01L 23/3121 |
| 2019/0304672 A1* | 10/2019 | Kang | .................... | H01F 27/363 |
| 2019/0304922 A1* | 10/2019 | Maruthamuthu | ... | H01L 23/3128 |

FOREIGN PATENT DOCUMENTS

| | | |
|---|---|---|
| JP | 2012009745 A | 1/2012 |
| JP | 2013038162 A | 2/2013 |
| JP | 2017174920 A | 9/2017 |
| WO | 2017122416 A1 | 7/2017 |
| WO | WO 2017/122416 * | 7/2017 |

OTHER PUBLICATIONS

Written Opinion of the International Searching Authority issued for PCT/JP2020/013022, dated Jun. 23, 2020.

* cited by examiner

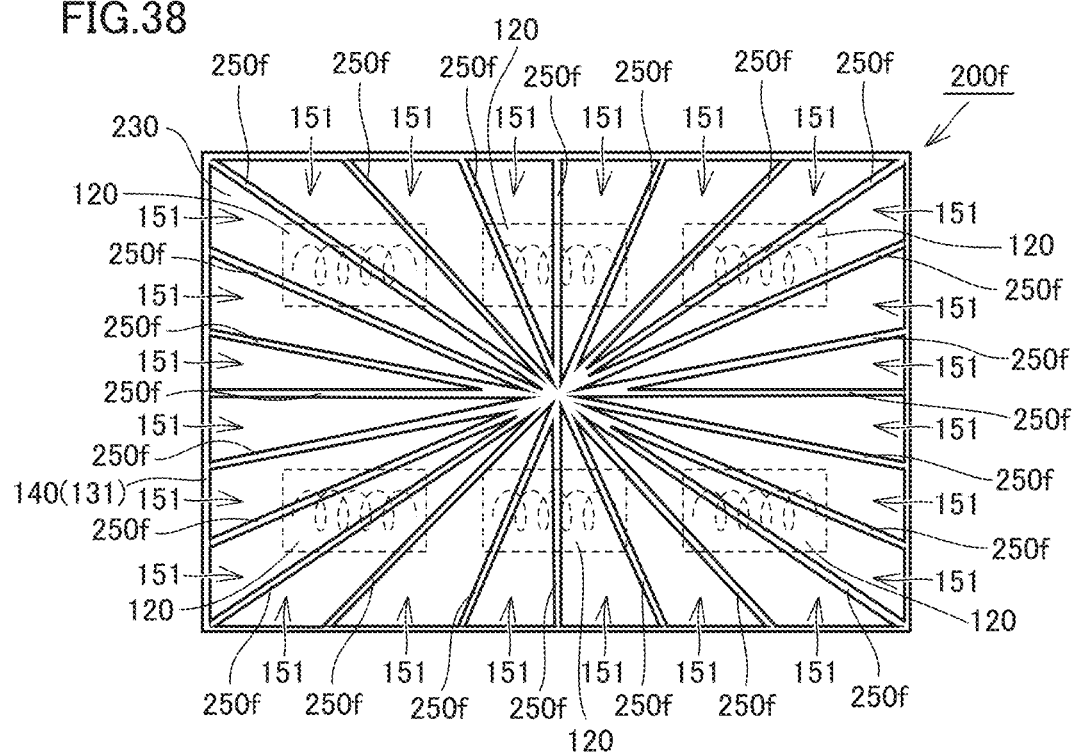

MODULE

CROSS REFERENCE TO RELATED APPLICATIONS

The present application is a continuation of PCT/JP2020/013022 filed Mar. 24, 2020, which claims priority to Japanese Patent Application No. 2019-058198, filed Mar. 26, 2019, the entire contents of each of which are incorporated herein by reference.

TECHNICAL FIELD

The present invention relates to a module.

BACKGROUND

Japanese Patent Laying-Open No. 2013-38162 (hereinafter "PTL 1") and Japanese Patent Laying-Open No. 2012-9745 (hereinafter "PTL 2") discloses examples of a configuration of a module.

The module described in PTL 1 includes a substrate, an electronic component, a resin layer, and a shield layer. The electronic component is mounted on the substrate. The resin layer seals the electronic component. The shield layer is provided on an upper surface and side surfaces of the resin layer. The shield layer is provided on a side on the upper surface of the resin layer with a plurality of cylindrical holes that lead to the resin layer.

The module described in PTL 2 includes a substrate, an electronic component, a sealing resin, and a shield layer. The electronic component is mounted on the substrate. The sealing resin is formed on the substrate to seal the electronic component. The shield layer has openings in a first predetermined pattern in a plan view, to cover a portion of the sealing resin. In addition, the shield layer is formed in a lattice shape in a plan view.

In these conventional modules, an inductor may be mounted as the electronic component mounted on the substrate. In this configuration, a magnetic field line generated when a current flows through the inductor reaches the shield layer. In the shield layer, an eddy current is generated with this magnetic field line serving as a central axis. The eddy current generates a magnetic field that would cancel a magnetic field generated by the magnetic field line described above. Thus, the magnetic field generated by the eddy current may deteriorate electrical characteristics of the inductor.

SUMMARY OF THE INVENTION

The exemplary embodiments of the present invention have been made in view of the aforementioned problem. Thus, it is an object thereof is to provide a module that can suppress deterioration of electrical characteristics of an inductor caused by a magnetic field generated by an eddy current.

In an exemplary aspect, a module is provided that includes a substrate, one or more inductors, a resin sealing portion, a ground conductor portion, and linear conductor portions. The substrate has a main surface, and each of the one or more inductors is disposed on the main surface. The resin sealing portion seals the one or more inductors and covers the main surface of the substrate. The ground conductor portion is disposed on an outer peripheral side of the substrate with respect to entirety of the one or more inductors, in a plan view. The plurality of linear conductor portions are electrically connected with the ground conductor portion. Moreover, the plurality of linear conductor portions are formed on the resin sealing portion and are disposed with gaps therebetween, such that the one or more inductors underlie at least one of the plurality of linear conductor portions, in a plan view.

According to the exemplary aspects of the present invention, deterioration of electrical characteristics of an inductor caused by a magnetic field generated by an eddy current is suppressed.

BRIEF DESCRIPTION OF DRAWINGS

FIG. 38 is a plan view of a module in accordance with a sixth variation of the second exemplary embodiment.

DETAILED DESCRIPTION OF EMBODIMENTS

Figure 1:
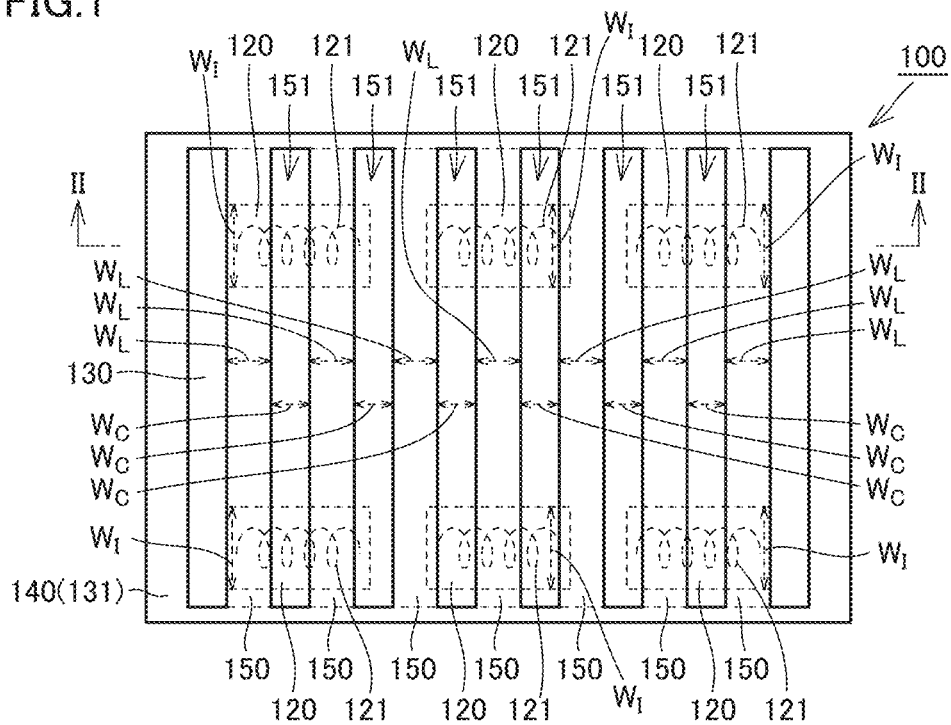
FIG. 1 is a plan view of a module in accordance with a first exemplary embodiment.

Hereinafter, a module in accordance with each exemplary embodiment of the present invention will be described with reference to the drawings. In the description of the embodiments below, identical or corresponding parts in the drawings will be designated by the same reference numerals, and the description thereof will not be repeated.

First Embodiment

Figure 2:
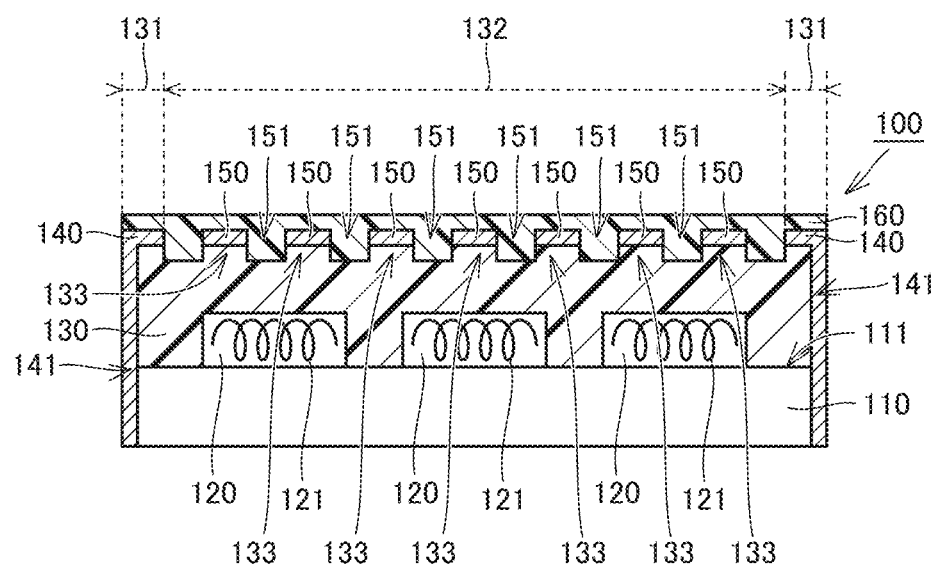
FIG. 2 is a cross sectional view of the module of FIG. 1 as viewed in a direction of arrows along a line II-II.

FIG. 1 is a plan view of a module in accordance with a first embodiment of the present invention. FIG. 2 is a cross sectional view of the module of FIG. 1 as viewed in a direction of arrows along a line II-II.

As shown in FIGS. 1 and 2, a module 100 in accordance with the first exemplary embodiment includes a substrate 110, one or more inductors 120, a resin sealing portion 130 (or simply a resin), a ground conductor portion 140 (or simply ground conductors), linear conductor portions 150 (or simply linear conductors), and a resin surface layer portion 160 (or simply a resin surface layer). It should be noted that resin surface layer portion 160 is not shown in FIG. 1.

As shown in FIG. 2, substrate 110 has a main surface 111. In the present embodiment, the direction of the normal to main surface 111 is the direction in which module 100 is viewed in a plan view. Substrate 110 is a ceramic multilayer substrate, for example. Moreover, substrate 110 can be a printed wiring board.

As shown in FIG. 2, the plurality of inductors 120 are disposed on main surface 111. Further, only one inductor 120 may be disposed on main surface 111 in an alternative aspect. Thus, in the present embodiment, each of one or more inductors 120 is disposed on main surface 111. It should be noted that another electronic component other than inductors 120 may be provided on main surface 111.

As shown in FIGS. 1 and 2, in module 100 in accordance with the first embodiment of the present invention, at least one of one or more inductors 120 includes a coiled conductor 121 having a central axis parallel to main surface 111 of substrate 110. In the present embodiment, specifically, the central axes of coiled conductors 121 in all inductors 120 are parallel to main surface 111 of substrate 110. In the present embodiment, the central axes of coiled conductors 121 are disposed to be parallel to each other, and in all inductors 120.

It should be noted that coiled conductors 121 are schematically shown in FIGS. 1 and 2. Coiled conductor 121 may be a pattern wiring or may be a wound wire. Coiled conductors 121 are mutually electrically connected with a mother substrate not shown, via substrate 110.

As shown in FIG. 2, resin sealing portion 130 seals one or more inductors 120 and covers main surface 111 of substrate 110. In the present embodiment, resin sealing portion 130 covers the entirety of main surface 111 of substrate 110, except for portions where inductors 120 are provided.

As also shown in FIG. 2, in module 100 in accordance with the first embodiment, a plurality of protruding strip portions 133 (or simply protruding strips) are formed in an upper surface of resin sealing portion 130. In the present embodiment, in a plan view, the plurality of protruding strip portions 133 are disposed to correspond to the plurality of linear conductor portions 150. Specifically, in a plan view, the plurality of protruding strip portions 133 are disposed to underlie the plurality of linear conductor portions 150.

The material for forming resin sealing portion 130 is not particularly limited. Resin sealing portion 130 is formed by an epoxy resin, for example.

As shown in FIGS. 1 and 2, ground conductor portion 140 is disposed on an outer peripheral side of substrate 110 with respect to the entirety of one or more inductors 120, in a plan view. In the present embodiment, ground conductor portion 140 is disposed in a first region 131 located on an outer peripheral side with respect to the entirety of one or more inductors 120, on resin sealing portion 130, in a plan view. Specifically, in a plan view, ground conductor portion 140 has a rectangular frame-like outer shape along a portion of first region 131 corresponding to outer peripheral edges of substrate 110.

As shown in FIG. 2, ground conductor portion 140 has a side surface portion 141. In the present embodiment, side surface portion 141 is disposed to cover the entirety of peripheral side surfaces of each of substrate 110 and resin sealing portion 130. Ground conductor portion 140 is electrically grounded through ground (GND) connection at side surface portion 141.

In the present embodiment, ground conductor portion 140 is provided to suppress noise from entering inductors 120 or other electronic components disposed on main surface 111 of substrate 110, by shielding electromagnetic waves from the outside of module 100.

As shown in FIG. 1, each of the plurality of linear conductor portions 150 is electrically connected with ground conductor portion 140. In the present embodiment, in a plan view, each of the plurality of linear conductor portions 150 extends to connect two sides of ground conductor portion 140 which are different from each other. Specifically, in a plan view, each of the plurality of linear conductor portions 150 extends to connect two sides of ground conductor portion 140 which are opposite to each other. That is, each of the plurality of linear conductor portions 150 is connected, at each of both ends thereof, to ground conductor portion 140. It should be noted that each of the plurality of linear conductor portions 150 may be configured to extend from ground conductor portion 140, and to be connected, at only one end thereof, to ground conductor portion 140, in a plan view.

In the present embodiment, in a plan view, each of linear conductor portions 150 in the present embodiment extends in a direction parallel to short sides of ground conductor portion 140. Further, in a plan view, each of linear conductor portions 150 extends in a direction in which it intersects the central axis of coiled conductor 121 of each of all inductors 120. In the present embodiment, the central axis of each of coiled conductors 121 of all inductors 120 and the direction in which each of all linear conductor portions 150 extends are perpendicular to each other.

As shown in FIGS. 1 and 2, the plurality of linear conductor portions 150 are disposed with gaps 151 therebetween, such that one or more inductors 120 underlie at least one of the plurality of linear conductor portions 150, in a plan view. In the present embodiment, the plurality of linear conductor portions 150 are disposed with gaps 151 therebetween, to cover a second region 132 surrounded by first region 131, in a plan view. Further, as shown in FIG. 1, in a plan view, the plurality of linear conductor portions 150 are disposed over the entirety of second region 132 by linearly extending to be parallel to each other. That is, in a plan view, the plurality of linear conductor portions 150 are disposed to overlap all inductors 120.

In the present embodiment, a width $W_C$ of gaps 151 described above in a plan view is designed to be ¼ or less of the wavelength of the electromagnetic waves to be shielded by the plurality of linear conductor portions 150. In an exemplary aspect, width $W_C$ of gaps 151 is 100 μm or 200 μm, for example. Further, as shown in FIG. 1, in a plan view, width $W_C$ of gaps 151 is smaller than a line width $W_L$ of each of the plurality of linear conductor portions 150. In a plan view, a dimension of line width $W_L$ of each of the plurality of linear conductor portions 150 is smaller than a dimension of a length $W_I$ in a short direction of each of one or more inductors 120.

It should be noted that, in the present embodiment, a width of gaps formed between the plurality of linear conductor portions 150 and ground conductor portion 140 in a plan view is formed to be substantially identical to width $W_C$ of gaps 151 described above.

As shown in FIG. 2, the plurality of linear conductor portions 150 are formed on resin sealing portion 130. Specifically, each of the plurality of linear conductor portions 150 is disposed on at least an upper end surface of each of the plurality of protruding strip portions 133. It is noted that although each of the plurality of linear conductor portions 150 is disposed over the entirety of the upper end surface described above, it may be disposed at a portion of the upper end surface. Further, each of the plurality of linear conductor portions 150 may be disposed on side surfaces of each of the plurality of protruding strip portions 133 in an exemplary aspect.

In the present embodiment, linear conductor portions 150 are electrically grounded by being electrically connected with ground conductor portion 140 as described above. Thus, linear conductor portions 150 are provided to suppress noise from entering inductors 120 or other electronic components disposed on main surface 111 of substrate 110, by shielding the electromagnetic waves from the outside of module 100.

As shown in FIG. 2, resin surface layer portion 160 is disposed to cover at least a portion of each of resin sealing portion 130 and the plurality of linear conductor portions 150. In the present embodiment, resin surface layer portion 160 is disposed to cover the entirety of the upper surface of each of resin sealing portion 130, ground conductor portion 140, and linear conductor portions 150, and thereby forms an upper end surface of module 100.

It is noted that although the material for forming resin surface layer portion 160 is not particularly limited, resin surface layer portion 160 is formed by an epoxy resin in an exemplary aspect. In general, the material for forming resin surface layer portion 160 may be the same as or different from the material for forming resin sealing portion 130.

Next, a method for manufacturing the module in accordance with the first exemplary embodiment will be described.

Figure 3:
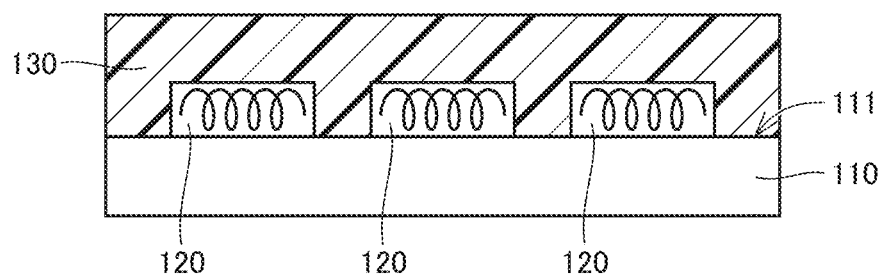
FIG. 3 is a cross sectional view showing a state where a substrate provided with inductors on a main surface is provided with a resin sealing portion, in a method for manufacturing the module in accordance with the first exemplary embodiment.

FIG. 3 is a cross sectional view showing a state where the substrate provided with the inductors on the main surface is provided with the resin sealing portion, in a method for manufacturing the module in accordance with the first exemplary embodiment. First, the plurality of inductors 120 are provided on main surface 111 of substrate 110. Then, as shown in FIG. 3, resin sealing portion 130 is provided on main surface 111 of substrate 110, by molding or the like, to seal inductors 120.

Figure 4:
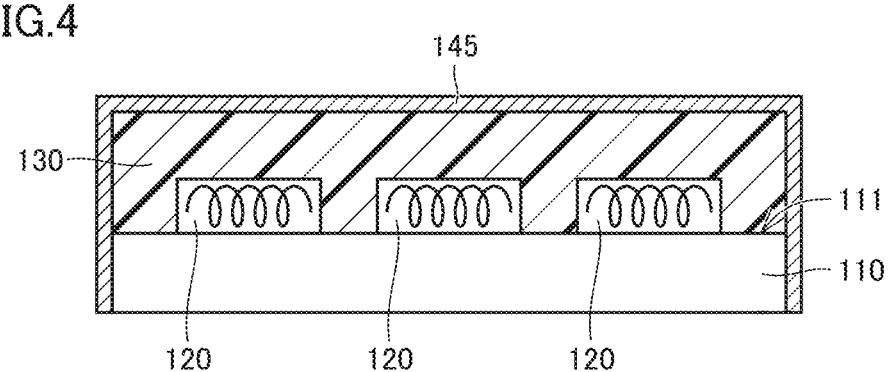
FIG. 4 is a cross sectional view showing a state where the resin sealing portion is provided with a conductive layer, in the method for manufacturing the module in accordance with the first exemplary embodiment.

FIG. 4 is a cross sectional view showing a state where the resin sealing portion is provided with a conductive layer, in the method for manufacturing the module in accordance with the first exemplary embodiment. As shown in FIG. 4, a conductive layer 145 is formed by a sputtering method or the like, to cover the upper surface of resin sealing portion 130 and the peripheral side surfaces of each of resin sealing portion 130 and substrate 110.

Figure 5:
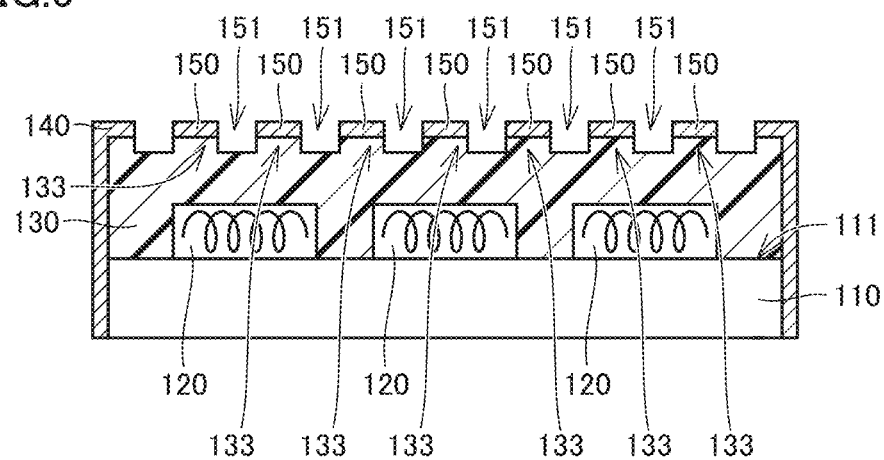
FIG. 5 is a cross sectional view showing a state where the conductive layer is provided with through grooves, in the method for manufacturing the module in accordance with the first exemplary embodiment.

FIG. 5 is a cross sectional view showing a state where the conductive layer is provided with through grooves, in the method for manufacturing the module in accordance with the first exemplary embodiment. The through grooves are formed by irradiating conductive layer 145 shown in FIG. 4 with laser beams, or performing dicing. As shown in FIG. 5, these through grooves form gaps 151 described above in the present embodiment. That is, through this step, conductive layer 145 is divided into linear conductor portions 150 and ground conductor portion 140. Further, by the irradiation of laser beams or the dicing described above, upper surfaces of portions of resin sealing portion 130 located below gaps 151 described above are ground. In second region 132 of resin sealing portion 130, portions other than the portions ground by the irradiation of laser beams or the dicing described above serve as protruding strip portions 133.

Then, resin surface layer portion 160 is provided by applying a resin to the upper surface of each of resin sealing portion 130, ground conductor portion 140, and linear conductor portions 150 and curing the resin. Through the steps described above, module 100 in accordance with the first exemplary embodiment as shown in FIG. 2 is manufactured.

In module 100 in accordance with the first exemplary embodiment, deterioration of electrical characteristics of inductor 120 caused by a magnetic field generated by an eddy current described later can be suppressed. The mechanism of suppressing deterioration of electrical characteristics of inductor 120 in module 100 in accordance with the first exemplary embodiment will be described below with reference to each comparative example described below.

Figure 6:
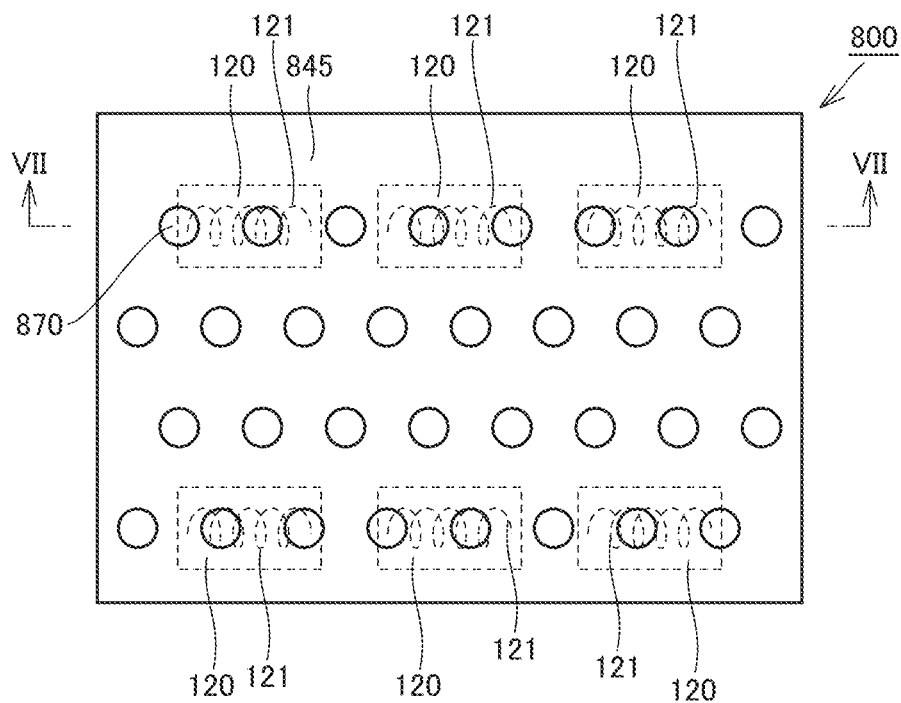
FIG. 6 is a plan view of a module in accordance with a first comparative example.
Figure 7:
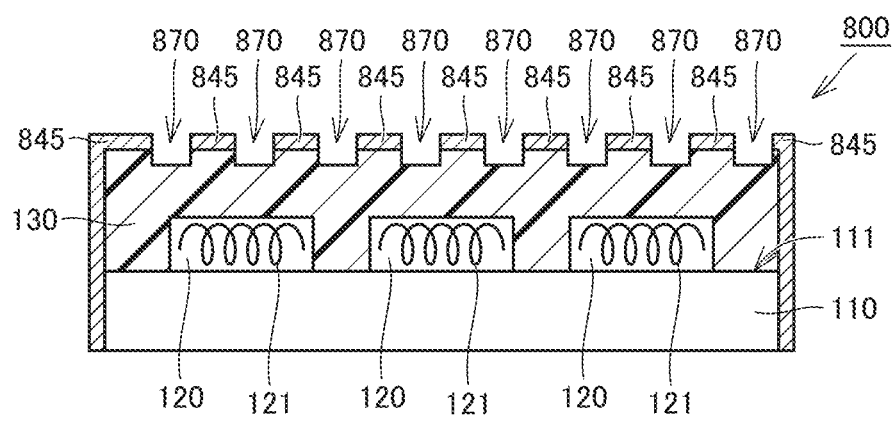
FIG. 7 is a cross sectional view of the module of FIG. 6 as viewed in a direction of arrows along a line VII-VII.

FIG. 6 is a plan view of a module in accordance with a first comparative example. FIG. 7 is a cross sectional view of the module of FIG. 6 as viewed in a direction of arrows along a line VII-VII.

As shown in FIGS. 6 and 7, a module 800 in accordance with the first comparative example is different from module 100 in accordance with the first embodiment of the present invention, mainly in that a conductive layer 845 is provided on the upper surface of resin sealing portion 130.

In module 800 in accordance with the first comparative example, conductive layer 845 has a plurality of through holes 870 in the shape of a plurality of circles. Each of the plurality of through holes 870 penetrates conductive layer 845 in an upward/downward direction. Further, in a plan view, the plurality of through holes 870 are disposed in a staggered manner.

Figure 8:
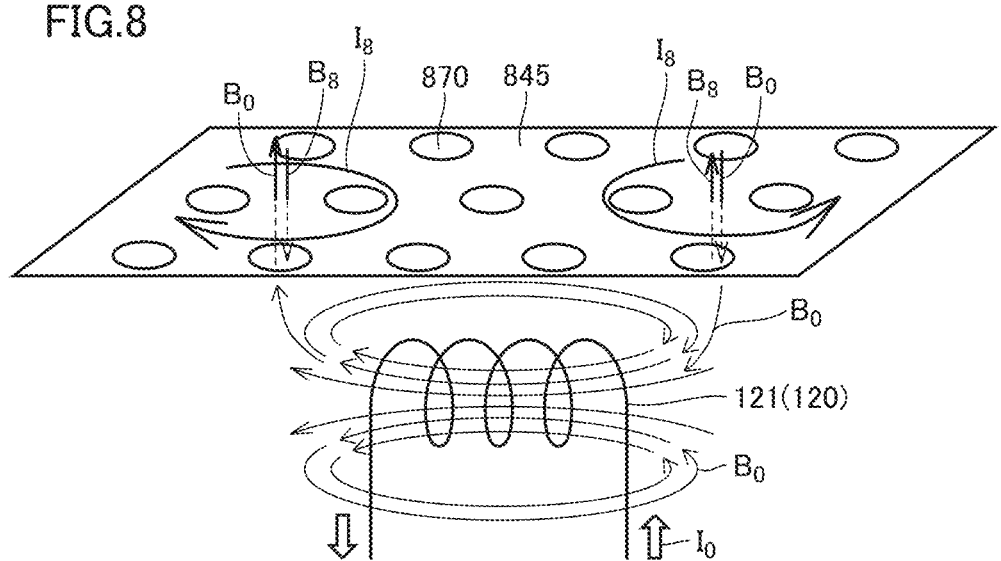
FIG. 8 is a schematic perspective view showing a manner in which an eddy current is generated in a conductive layer in the module in accordance with the first comparative example.

In module 800 in accordance with the first comparative example, an eddy current is generated in conductive layer 845. FIG. 8 is a schematic perspective view showing a manner in which an eddy current is generated in the conductive layer in the module in accordance with the first comparative example.

As shown in FIG. 8, in module 800 in accordance with the first comparative example, a current $I_0$ flows through coiled conductor 121 of inductor 120, and thereby a magnetic field line $B_0$ is generated. When magnetic field line $B_0$ passes through conductive layer 845 in a direction substantially perpendicular to a planar direction of conductive layer 845, an eddy current $I_8$ is generated along an in-plane direction of conductive layer 845. This eddy current $I_8$ flows on a substantially circular path that would circle about a central axis oriented in a direction in which magnetic field line $B_0$ passing through conductive layer 845 is oriented. Eddy current $I_8$ generates a magnetic field line $B_8$ oriented in a direction in which it would cancel a magnetic field generated by magnetic field line $B_0$ described above.

As shown in FIG. 8, in module 800 in accordance with the first comparative example, eddy current $I_8$ follows the path that would bypass the plurality of through holes 870. Thereby, relatively large magnetic field line $B_8$ generated by eddy current $I_8$ weakens a magnetic field which acts on inductor 120, and deteriorates electrical characteristics of inductor 120.

Figure 9:
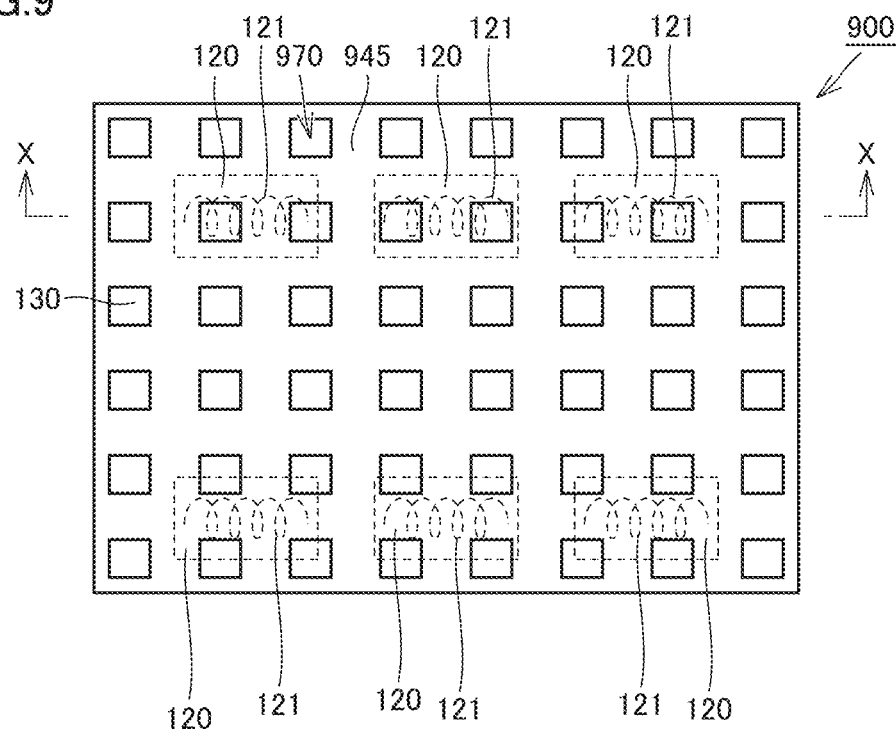
FIG. 9 is a plan view of a module in accordance with a second comparative example.
Figure 10:
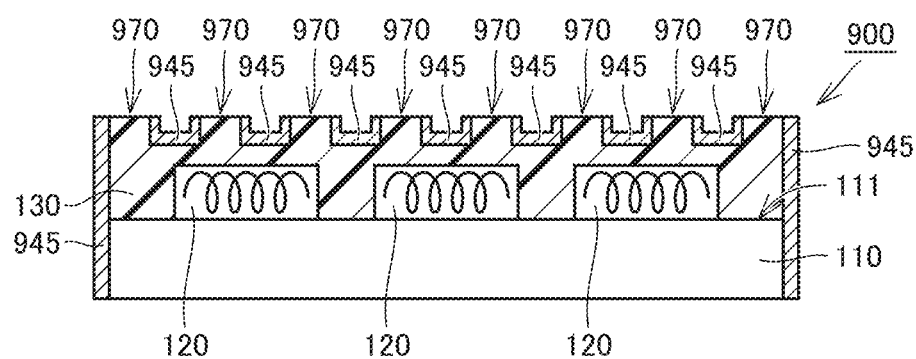
FIG. 10 is a cross sectional view of the module of FIG. 9 as viewed in a direction of arrows along a line X-X.

FIG. 9 is a plan view of a module in accordance with a second comparative example. FIG. 10 is a cross sectional view of the module of FIG. 9 as viewed in a direction of arrows along a line X-X.

As shown in FIGS. 9 and 10, a module 900 in accordance with the second comparative example is different from module 100 in accordance with the first embodiment of the present invention, mainly in that a conductive layer 945 is provided on the upper surface of resin sealing portion 130.

In module 900 in accordance with the second comparative example, conductive layer 945 has a plurality of rectangular openings 970. Conductive layer 945 is not formed in openings 970. Further, the plurality of openings 970 are disposed such that conductive layer 945 has a lattice-like outer shape in a plan view.

Figure 11:
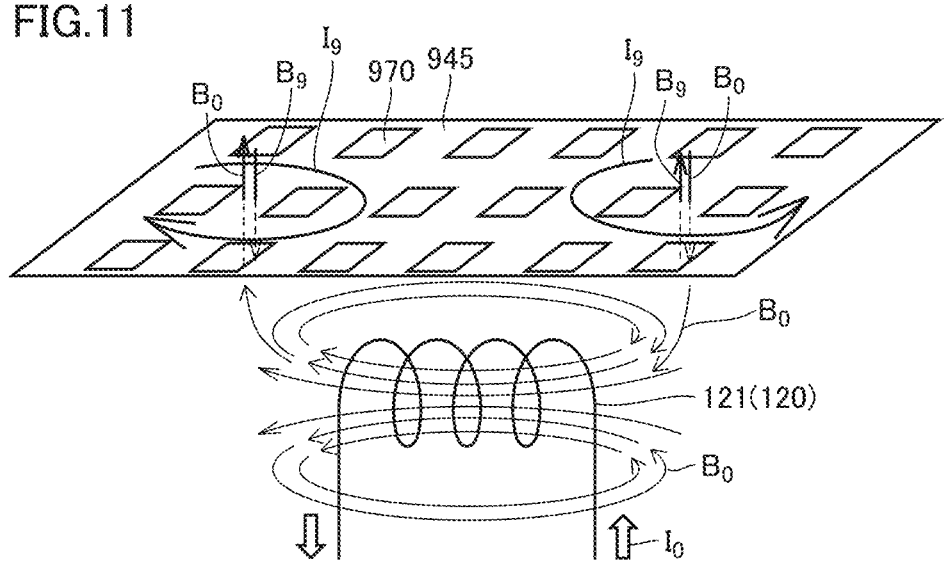
FIG. 11 is a schematic perspective view showing a manner in which an eddy current is generated in a conductive layer in the module in accordance with the second comparative example.

Also in module 900 in accordance with the second comparative example, an eddy current is generated in conductive layer 945, as in the first comparative example. FIG. 11 is a schematic perspective view showing a manner in which an eddy current is generated in the conductive layer in the module in accordance with the second comparative example.

As shown in FIG. 11, as in module 800 in accordance with the first comparative example, an eddy current $I_9$ is generated along an in-plane direction of conductive layer 945. Eddy current $I_9$ generates a magnetic field line $B_9$ oriented in a direction in which it would cancel a magnetic field generated by magnetic field line $B_0$ described above.

Eddy current $I_9$ follows a path that would bypass the plurality of openings 970. Thereby, relatively large magnetic field line $B_9$ generated by eddy current $I_9$ weakens a magnetic field which acts on inductor 120, and deteriorates electrical characteristics of inductor 120.

Figure 12:
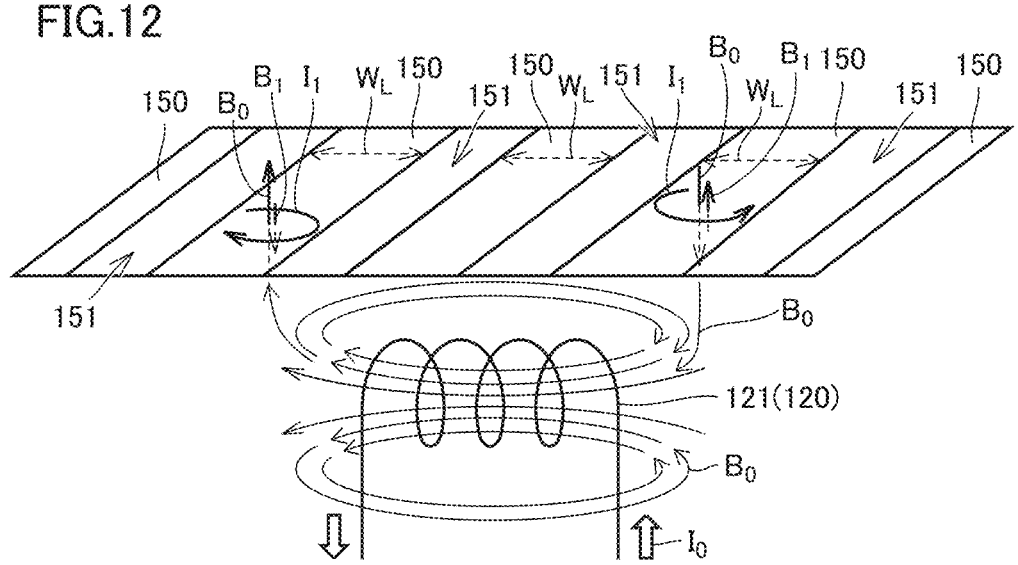
FIG. 12 is a schematic perspective view showing a manner in which an eddy current is generated in the conductive layer in the module in accordance with the first exemplary embodiment.

In module 100 in accordance with the first embodiment of the present invention, an eddy current is generated in linear conductor portion 150. FIG. 12 is a schematic perspective view showing a manner in which an eddy current is generated in the conductive layer in the module in accordance with the first embodiment of the present invention.

As shown in FIG. 12, in module 100 in accordance with the first exemplary embodiment, when magnetic field line $B_0$ passes through linear conductor portion 150 in a direction substantially perpendicular to a planar direction of linear conductor portion 150, an eddy current $I_1$ is generated along an in-plane direction of linear conductor portion 150. This eddy current $I_1$ flows on a substantially circular path that would circle about a central axis oriented in a direction in which magnetic field line $B_0$ passing through linear conductor portion 150 is oriented. Eddy current $I_1$ generates a magnetic field line $B_1$ that would cancel a magnetic field generated by magnetic field line $B_0$ described above.

As shown in FIG. 12, the length of a virtual diameter of the substantially circular path of eddy current $I_1$ is less than or equal to line width $W_L$ of each of the plurality of linear conductor portions 150. Thus, the length of eddy current $I_1$ in the present embodiment is shorter than the lengths of the paths of eddy currents $I_8$ and $I_9$ in the first and second comparative examples. That is, the strength of magnetic field line $B_1$ generated by eddy current $I_1$ in the present embodiment is smaller than the strengths of magnetic field lines $B_8$ and $B_9$ respectively generated by eddy currents $I_8$ and $I_9$ in the first and second comparative examples. Thus, since the strength of magnetic field line $B_1$ generated by eddy current $I_1$ is reduced in module 100 in accordance with the first embodiment, degradation of characteristics of the inductor caused by magnetic field line $B_1$ is suppressed.

As described above, in module 100 in accordance with the first exemplary embodiment, each of the plurality of linear conductor portions 150 is electrically connected with ground conductor portion 140. As shown in FIG. 1, the plurality of linear conductor portions 150 are disposed with gaps 151 therebetween, such that one or more inductors 120 underlie at least one of the plurality of linear conductor portions 150, in a plan view.

Thereby, ground conductor portion 140 and linear conductor portions 150 can be configured to function for shielding electromagnetic waves having a predetermined wavelength, and a current path of an eddy current generated in linear conductor portion 150 by inductor 120 can be shortened. Since the strength of magnetic field line $B_1$ generated by eddy current $I_1$ is thereby reduced, degradation of characteristics of inductor 120 caused by magnetic field line $B_1$ generated by eddy current $I_1$ can be suppressed.

In module 100 in accordance with the first exemplary embodiment, in a plan view, the dimension of line width $W_L$ of each of the plurality of linear conductor portions 150 is smaller than the dimension of length $W_I$ in the short direction of each of one or more inductors 120.

Thereby, the current path of eddy current $I_1$ can be further shortened. Thus, the strength of magnetic field line $B_1$ generated by eddy current $I_1$ can be further reduced, and degradation of characteristics of inductor 120 can be suppressed.

In module 100 in accordance with the first exemplary embodiment, in a plan view, width $W_C$ of gaps 151 described above is smaller than line width $W_L$ of each of the plurality of linear conductor portions 150.

Thereby, the function of shielding the electromagnetic waves having the predetermined wavelength in linear conductor portions 150 is improved, while shortening the length of the current path of eddy current $I_1$ generated in linear conductor portion 150.

In module 100 in accordance with the first exemplary embodiment, in a plan view, ground conductor portion 140 has a rectangular frame-like outer shape along first region 131. In a plan view, each of the plurality of linear conductor portions 150 extends to connect two sides of ground conductor portion 140 which are different from each other.

Thereby, the distance from ground conductor portion 140 at any location of linear conductor portion 150 can be reduced, when compared with a case where only one end of each linear conductor portion 150 is connected with ground conductor portion 140. Thus, the function of shielding the electromagnetic waves having the predetermined wavelength in linear conductor portions 150 can be improved.

In module 100 in accordance with the first exemplary embodiment, in a plan view, each of the plurality of linear conductor portions 150 extends to connect two sides of ground conductor portion 140 which are opposite to each other.

Thereby, the entire strength of ground conductor portion 140 and linear conductor portions 150 can be improved.

In module 100 in accordance with the first exemplary embodiment, at least one of one or more inductors 120 includes coiled conductor 121 having the central axis parallel to main surface 111 of substrate 110.

Even when eddy current $I_1$ is generated in linear conductor portion 150 by a magnetic field generated by inductor 120 including coiled conductor 121 as described above, the path of eddy current $I_1$ in the present embodiment is comparatively short and the strength of magnetic field line $B_1$ generated by this eddy current $I_1$ is comparatively small, and thus degradation of characteristics of inductor 120 is suppressed.

In module 100 in accordance with the first exemplary embodiment, in a plan view, the plurality of linear conductor portions 150 are disposed over the entirety of second region 132 by linearly extending to be parallel to each other.

Thereby, the gaps between linear conductor portions 150 are reduced, and the function of shielding the electromagnetic waves having the predetermined wavelength in the plurality of linear conductor portions 150 is improved.

In module 100 in accordance with the first exemplary embodiment, the plurality of protruding strip portions 133 are formed in the upper surface of resin sealing portion 130. Each of the plurality of linear conductor portions 150 is disposed on at least the upper end surface of each of the plurality of protruding strip portions 133.

In module 100 in accordance with the present exemplary embodiment having the above configuration, linear conductor portions 150 can be disposed on the upper surface of resin sealing portion 130 by providing the conductor portions to correspond to the upper end surfaces of the plurality of protruding strip portions 133.

Module 100 in accordance with the first exemplary embodiment further includes resin surface layer portion 160 disposed to cover at least a portion of each of resin sealing portion 130 and the plurality of linear conductor portions 150.

With the above configuration, printing can be easily performed on resin surface layer portion 160 in module 100 in accordance with the present embodiment including linear conductor portions 150, in order to enhance discriminability from other modules.

Although each of the plurality of linear conductor portions 150 extends in the direction parallel to the short sides of ground conductor portion 140 in module 100 in accordance with the first exemplary embodiment shown in FIGS. 1 and 2, it is noted that the direction in which each of the plurality of linear conductor portions 150 extends is not particularly limited. Here, a description will be given of a module in accordance with each variation of the first exemplary embodiment, which is different from the first embodiment in the direction in which the plurality of linear conductor portions extend.

It should be noted that the description of the same components as those of module 100 in accordance with the first exemplary embodiment will not be repeated.

Figure 13:
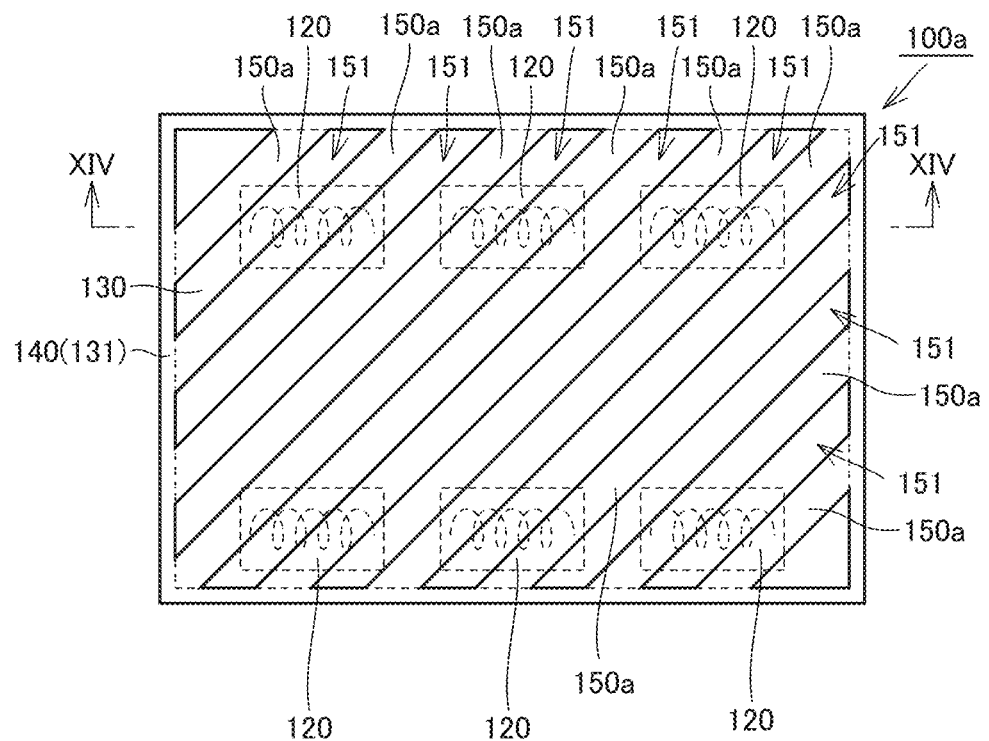
FIG. 13 is a plan view of a module in accordance with a first variation of the first exemplary embodiment.
Figure 14:
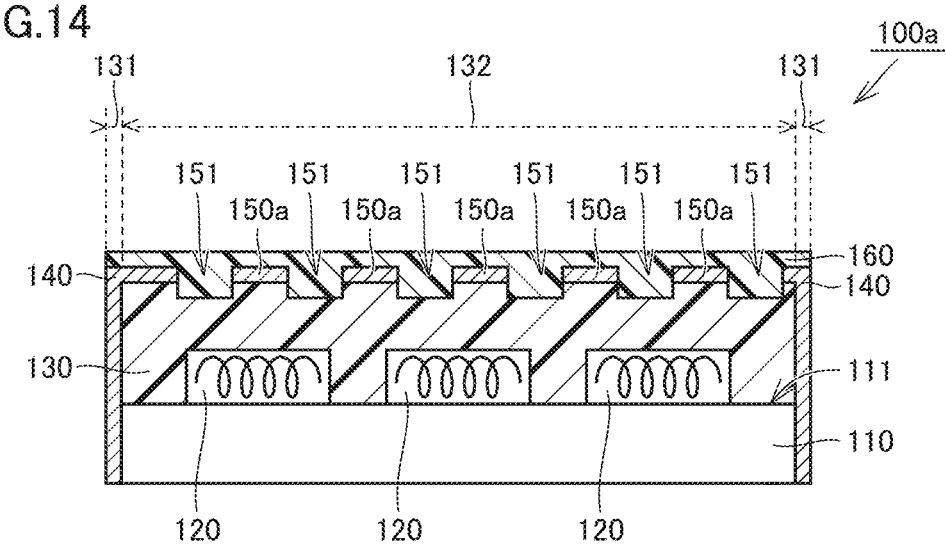
FIG. 14 is a cross sectional view of the module of FIG. 13 as viewed in a direction of arrows along a line XIV-XIV.

FIG. 13 is a plan view of a module in accordance with a first variation of the first exemplary embodiment. FIG. 14 is a cross sectional view of the module of FIG. 13 as viewed in a direction of arrows along a line XIV-XIV.

As shown in FIGS. 13 and 14, in a module 100a, a plurality of linear conductor portions 150a extend in a direction in which they intersect each of a short side and a long side of ground conductor portion 140, in a plan view.

At least one linear conductor portion 150a in module 100a extends linearly and to connect two sides of ground conductor portion 140 which are adjacent to each other, in a plan view.

Figure 15:
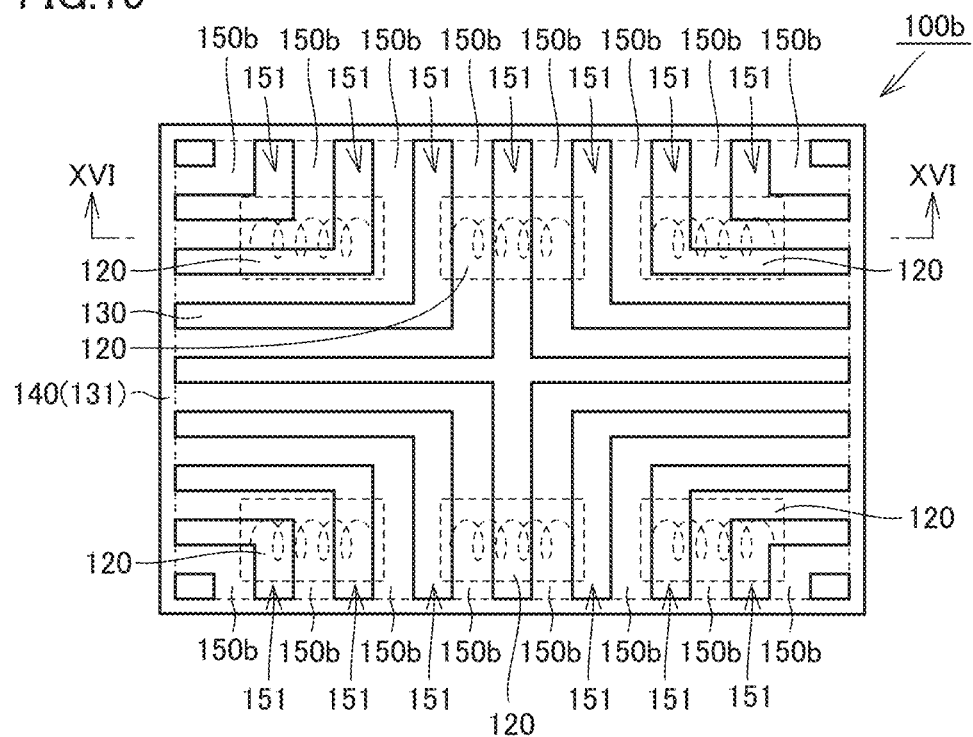
FIG. 15 is a plan view of a module in accordance with a second variation of the first exemplary embodiment.
Figure 16:
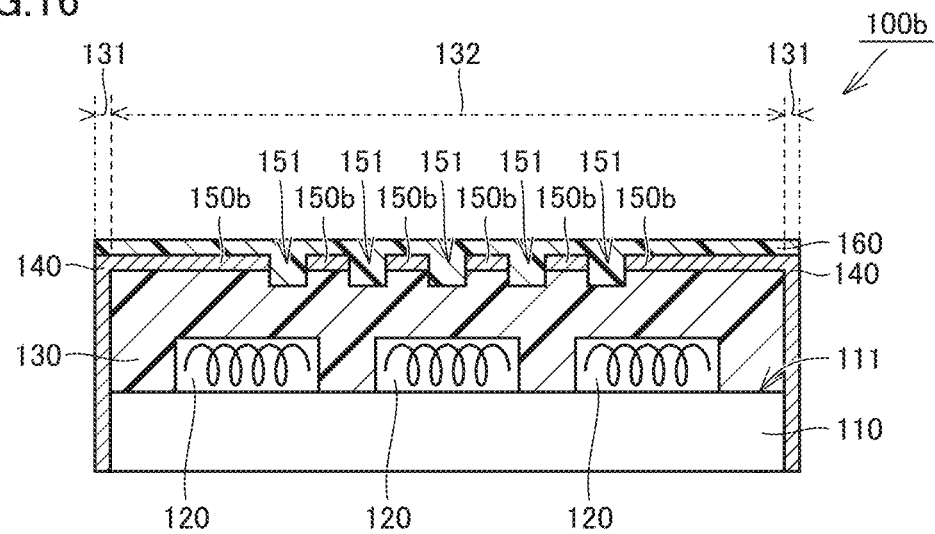
FIG. 16 is a cross sectional view of the module of FIG. 15 as viewed in a direction of arrows along a line XVI-XVI.

FIG. 15 is a plan view of a module in accordance with a second variation of the first exemplary embodiment. FIG. 16 is a cross sectional view of the module of FIG. 15 as viewed in a direction of arrows along a line XVI-XVI.

As shown in FIGS. 15 and 16, in a module 100b, each of a plurality of linear conductor portions 150b extends while bending, to connect two sides of ground conductor portion 140 which are adjacent to each other, in a plan view. Thereby, the entire strength of ground conductor portion 140 and linear conductor portions 150b can be improved.

As described above, in the plurality of linear conductor portions 150a and 150b in the first and second variations of the first exemplary embodiment, the plurality of linear conductor portions 150a and 150b are disposed with gaps 151 therebetween, such that each of one or more inductors 120 underlies at least one of the plurality of linear conductor portions 150a and 150b, in a plan view. Thereby, deterioration of electrical characteristics of inductor 120 caused by a magnetic field generated by an eddy current can be suppressed.

Although the central axes of coiled conductors 121 of the plurality of inductors 120 are oriented in a specific direction in module 100 in accordance with the first exemplary embodiment shown in FIGS. 1 and 2, it is noted that the direction in which the central axes described above are oriented is not particularly limited. Here, a description will be given of a module in accordance with each variation of the first exemplary embodiment, which is different from the first embodiment in the direction in which the central axes of the coiled conductors of the inductors are oriented. It should be noted that the description of the same components as those of module 100 in accordance with the first exemplary embodiment will not be repeated.

Figure 17:
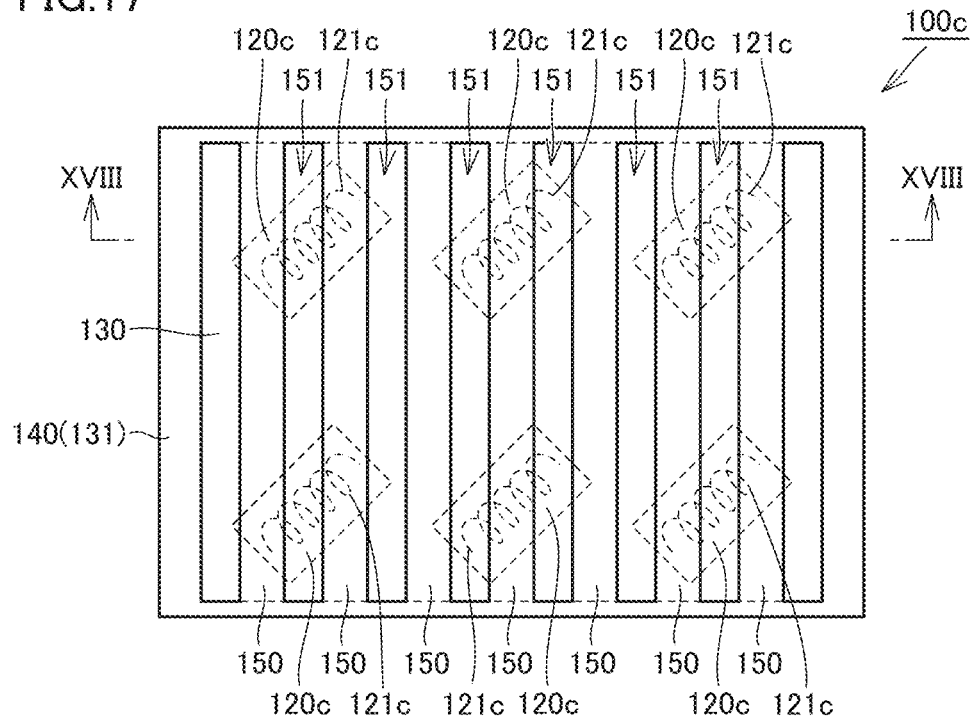
FIG. 17 is a plan view of a module in accordance with a third variation of the first exemplary embodiment.
Figure 18:
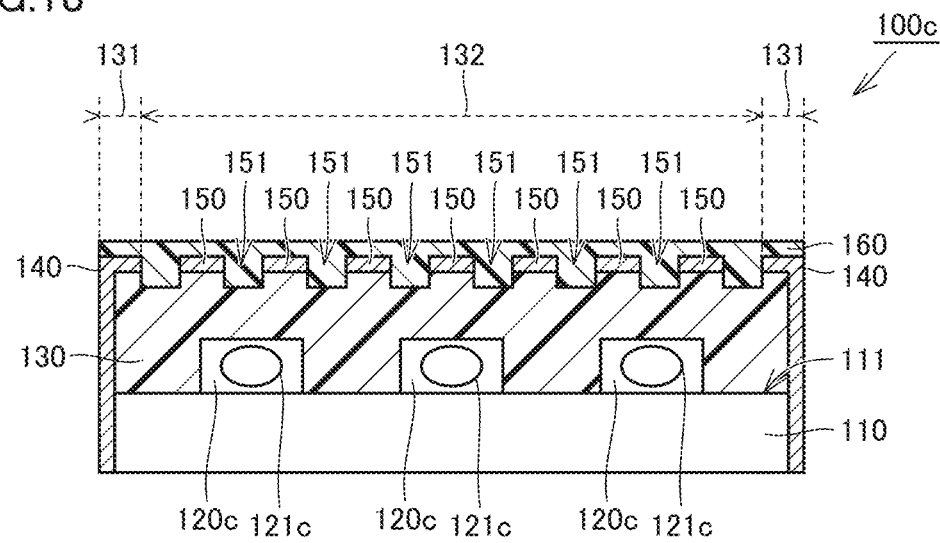
FIG. 18 is a cross sectional view of the module of FIG. 17 as viewed in a direction of arrows along a line XVIII-XVIII.

FIG. 17 is a plan view of a module in accordance with a third variation of the first exemplary embodiment. FIG. 18 is a cross sectional view of the module of FIG. 17 as viewed in a direction of arrows along a line XVIII-XVIII.

As shown in FIGS. 17 and 18, in a module 100c in accordance with the third variation of the first exemplary embodiment, the central axes of coiled conductors 121c of all inductors 120c and the direction in which each of all linear conductor portions 150 extends intersect each other.

Figure 19:
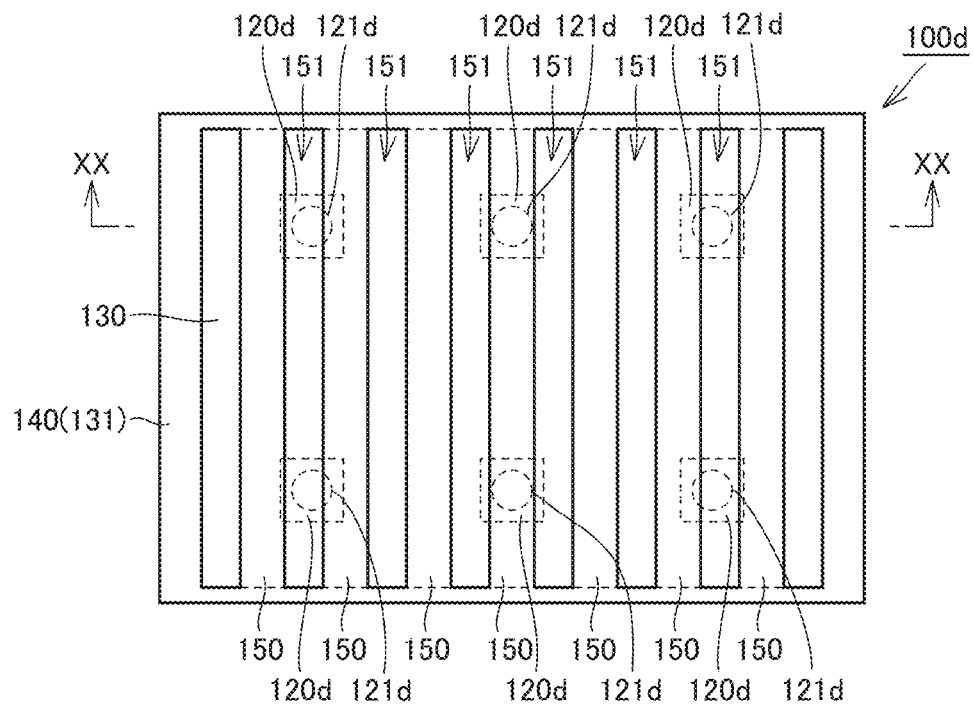
FIG. 19 is a plan view of a module in accordance with a fourth variation of the first exemplary embodiment.
Figure 20:
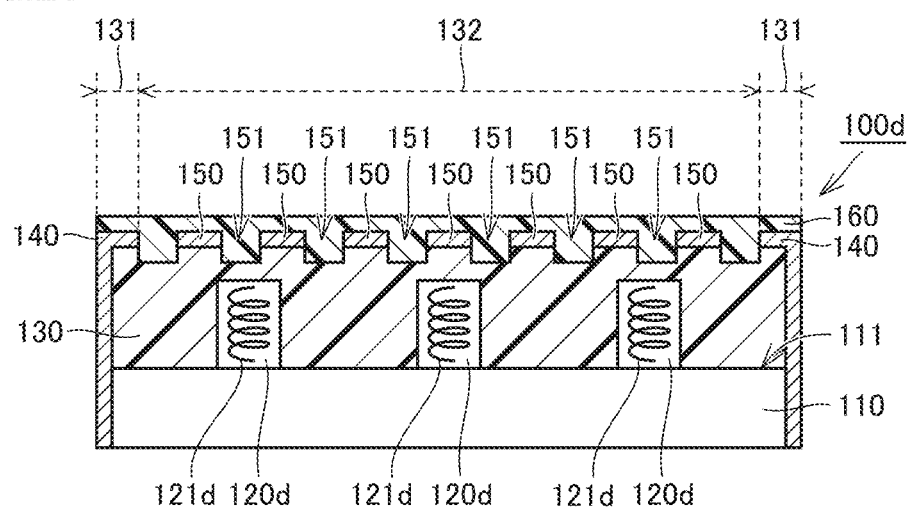
FIG. 20 is a cross sectional view of the module of FIG. 19 as viewed in a direction of arrows along a line XX-XX.

FIG. 19 is a plan view of a module in accordance with a fourth variation of the first exemplary embodiment. FIG. 20 is a cross sectional view of the module of FIG. 19 as viewed in a direction of arrows along a line XX-XX.

As shown in FIGS. 19 and 20, in a module 100d in accordance with the fourth variation of the first exemplary embodiment, the central axes of coiled conductors 121d of all inductors 120d are oriented in the direction of the normal to main surface 111 of substrate 110. Thus, at least one of one or more inductors 120d includes coiled conductor 121d having a central axis perpendicular to main surface 111 of substrate 110.

Even when an eddy current is generated in linear conductor portion 150 by a magnetic field generated by inductor 120d including coiled conductor 121d as described above, the path of the eddy current in the present embodiment is short, and thus degradation of characteristics of inductor 120d is suppressed.

Figure 21:
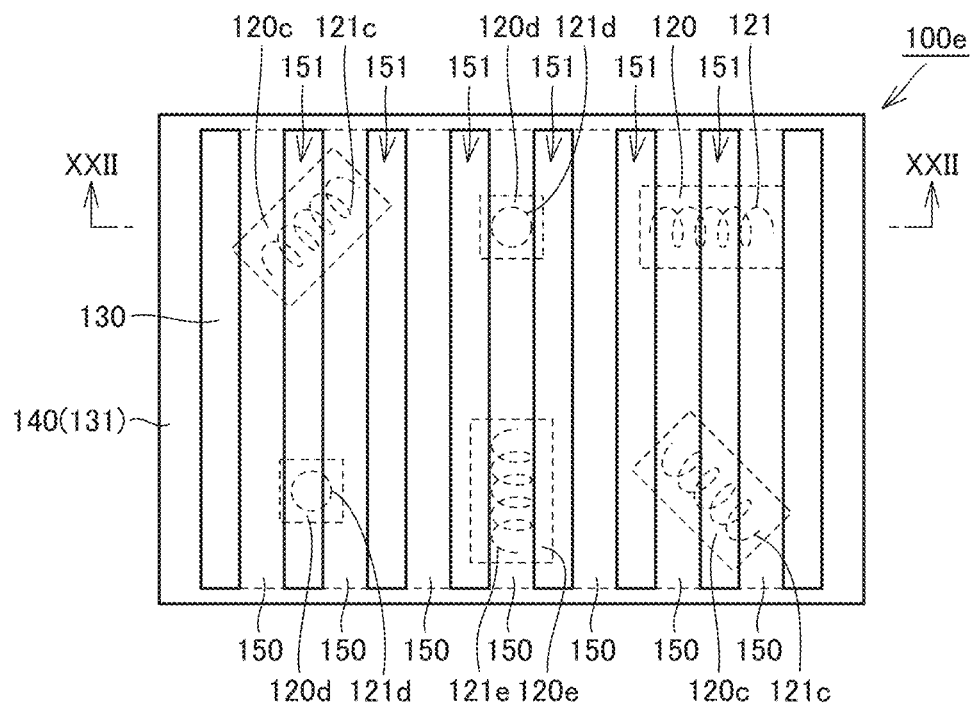
FIG. 21 is a plan view of a module in accordance with a fifth variation of the first exemplary embodiment.
Figure 22:
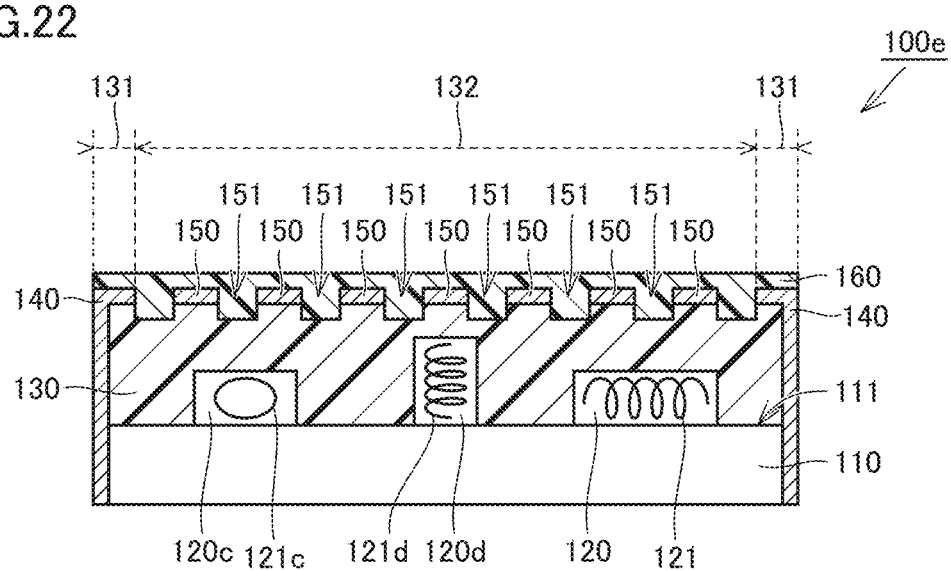
FIG. 22 is a cross sectional view of the module of FIG. 21 as viewed in a direction of arrows along a line XXII-XXII.

FIG. 21 is a plan view of a module in accordance with a fifth variation of the first exemplary embodiment. FIG. 22 is a cross sectional view of the module of FIG. 21 as viewed in a direction of arrows along a line XXII-XXII.

As shown in FIGS. 21 and 22, in a module 100e in accordance with the fifth variation of the first exemplary embodiment, the central axis of coiled conductor 121 of at least one inductor 120 and the direction in which each of the plurality of linear conductor portions 150 extends are perpendicular to each other. As further shown, the central axis of coiled conductor 121c of at least one inductor 120c different from inductor 120 described above and the direction in which each of all linear conductor portions 150 extends intersect each other. Further, the central axis of coiled conductor 121d of at least one inductor 120d different from inductors 120 and 120c described above are oriented in the direction of the normal to main surface 111 of substrate 110. Further, the central axis of a coiled conductor 121e of at least one inductor 120e different from inductors 120, 120c, and 120d described above and the direction in which each of the plurality of linear conductor portions 150 extends are parallel to each other.

A magnetic field line generated by each of inductors 120c, 120d, and 120e in the third, fourth, and fifth variations of the first exemplary embodiment passes through linear conductor portion 150 in a direction substantially perpendicular to the planar direction of linear conductor portion 150. Thus, in each of the third, fourth, and fifth variations, an eddy current is generated along the in-plane direction of linear conductor portion 150, as in the first exemplary embodiment. Thereby, in each of the third, fourth, and fifth variations, deterioration of electrical characteristics of inductors 120c, 120d, and 120e caused by a magnetic field generated by an eddy current is suppressed by the plurality of linear conductor portions 150 having the same outer shape as that in the first embodiment of the present invention.

Second Exemplary Embodiment

Next, a module in accordance with a second exemplary embodiment will be described. In the module in accordance with the second exemplary embodiment, positions at which linear conductor portions are provided on a resin sealing portion are different from those in module 100 in accordance with the first exemplary embodiment. Thus, the description of the configuration other than the positions at which the linear conductor portions are provided on the resin sealing portion will not be repeated.

Figure 23:
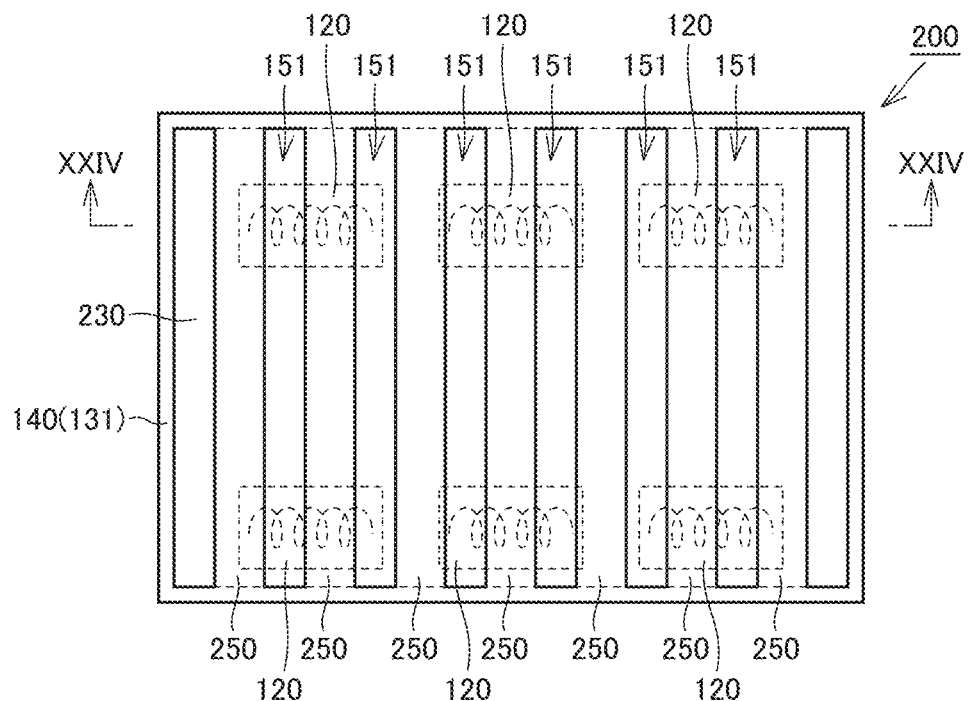
FIG. 23 is a plan view of a module in accordance with a second exemplary embodiment.
Figure 24:
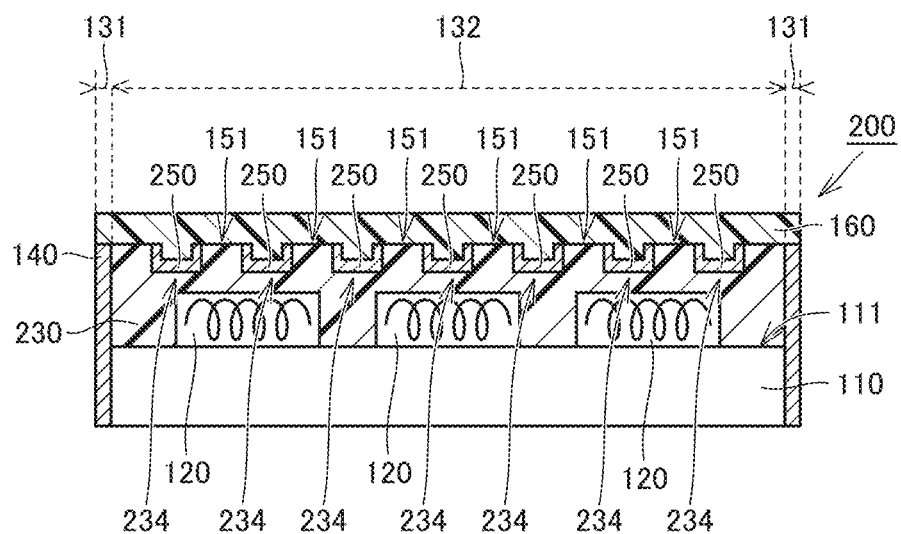
FIG. 24 is a cross sectional view of the module of FIG. 23 as viewed in a direction of arrows along a line XXIV-XXIV.

FIG. 23 is a plan view of the module in accordance with the second exemplary embodiment. FIG. 24 is a cross sectional view of the module of FIG. 23 as viewed in a direction of arrows along a line XXIV-XXIV.

As shown in FIGS. 23 and 24, in a module 200 in accordance with the second exemplary embodiment, a plurality of recessed strip portions 234 are formed in an upper surface of a resin sealing portion 230. Each of a plurality of linear conductor portions 250 is disposed on at least a bottom surface of each of the plurality of recessed strip portions 234. It is noted that although each of the plurality of linear conductor portions 250 are disposed over the entirety of the bottom surface of each of the plurality of recessed strip portions 234, it may be disposed at a portion of the bottom surface described above. Further, although each of the plurality of linear conductor portions 250 is also disposed on inner side surfaces of each of the plurality of recessed strip portions 234 in the present embodiment, the plurality of linear conductor portions 250 may be disposed on only the bottom surfaces of recessed strip portions 234 in an alternative aspect.

As described above, in module 200 in accordance with the present embodiment, each of the plurality of linear conductor portions 250 is disposed on at least the bottom surface of each of the plurality of recessed strip portions 234. With this configuration, in the present embodiment, linear conductor portions 250 can be disposed on the upper surface of resin sealing portion 230 by providing the conductor portions to correspond to the bottom surfaces of the plurality of recessed strip portions 234.

Next, a method for manufacturing module 200 in accordance with the second embodiment of the present invention will be described.

Figure 25:
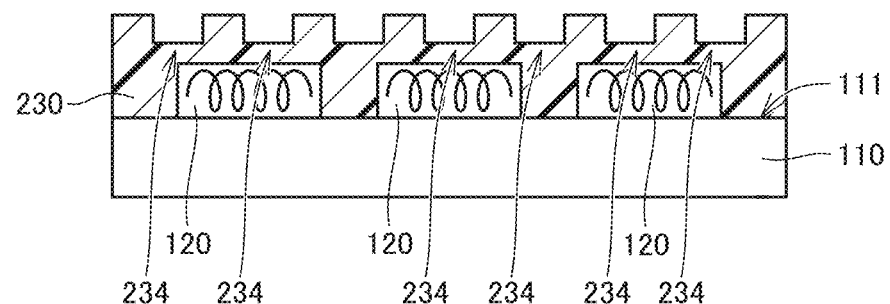
FIG. 25 is a view showing a state where a resin sealing portion is provided with a plurality of recessed strip portions, in a method for manufacturing the module in accordance with the second exemplary embodiment.

FIG. 25 is a view showing a state where the resin sealing portion is provided with the plurality of recessed strip portions, in a method for manufacturing the module in accordance with the second exemplary embodiment. First, as in the method for manufacturing module 100 in accordance with the first exemplary embodiment shown in FIG. 3, resin sealing portion 230 is provided on main surface 111 of substrate 110, while sealing inductors 120. Then, as shown in FIG. 25, recessed strip portions 234 are formed by grinding portions of the upper surface of resin sealing portion 230 by irradiating the upper surface of resin sealing portion 230 with laser.

Figure 26:
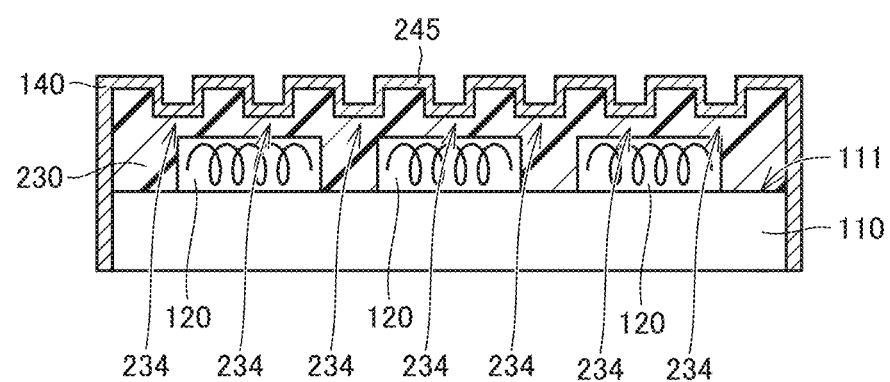
FIG. 26 is a cross sectional view showing a state where the resin sealing portion is provided with a conductive layer, in the method for manufacturing the module in accordance with the second exemplary embodiment.

FIG. 26 is a cross sectional view showing a state where the resin sealing portion is provided with a conductive layer, in the method for manufacturing the module in accordance with the second exemplary embodiment. As shown in FIG.

26, a conductive layer 245 is formed by sputtering, to cover the entirety of resin sealing portion 230 and the peripheral side surfaces of substrate 110.

Figure 27:
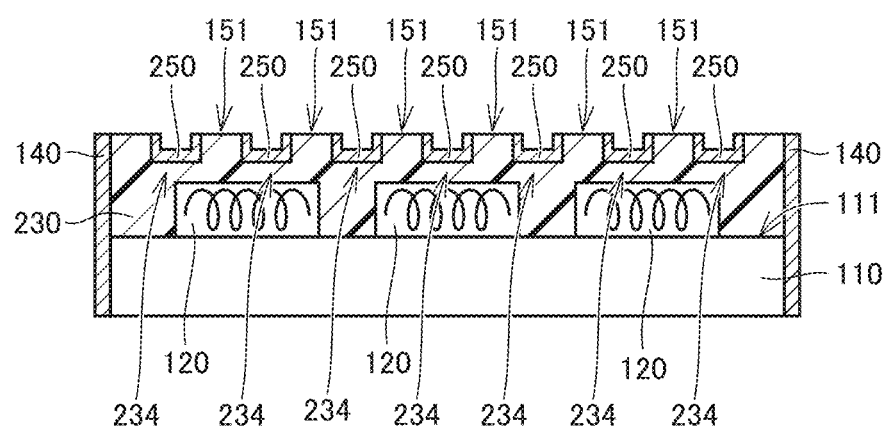
FIG. 27 is a view showing a state where an upper end portion of the conductive layer is ground, in the method for manufacturing the module in accordance with the second exemplary embodiment.

FIG. 27 is a view showing a state where an upper end portion of the conductive layer is ground, in the method for manufacturing the module in accordance with the second exemplary embodiment. By grinding the upper end portion of conductive layer 245 shown in FIG. 26 from an upper end surface side, portions of resin sealing portion 230 other than recessed strip portions 234 are exposed as shown in FIG. 27. That is, through this step, conductive layer 245 is divided into linear conductor portions 250 and ground conductor portion 140.

Then, resin surface layer portion 160 is provided by applying a resin to the upper surface of each of resin sealing portion 230, ground conductor portion 140, and linear conductor portion 250 and curing the resin. Through the steps described above, module 200 in accordance with the second exemplary embodiment as shown in FIG. 24 is manufactured.

In the following, a description will be given of a module in accordance with each variation of the second exemplary embodiment. Concerning each variation of the second exemplary embodiment, the description of the same components as those of module 200 in accordance with the second exemplary embodiment will not be repeated.

Figure 28:
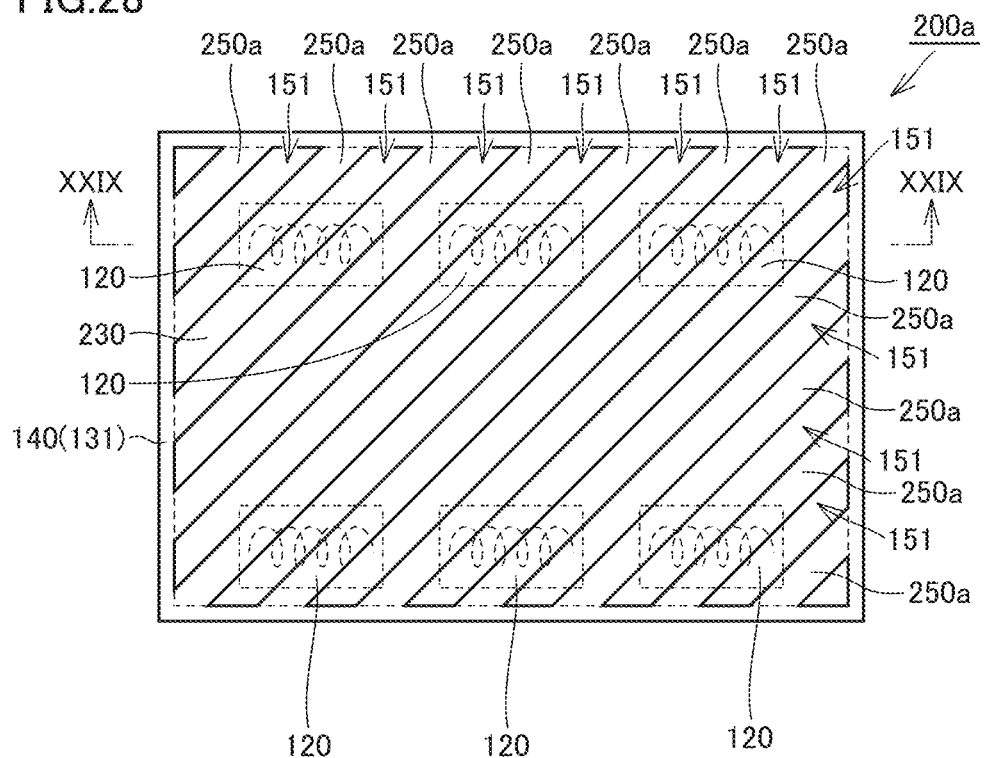
FIG. 28 is a plan view of a module in accordance with a first variation of the second exemplary embodiment.
Figure 29:
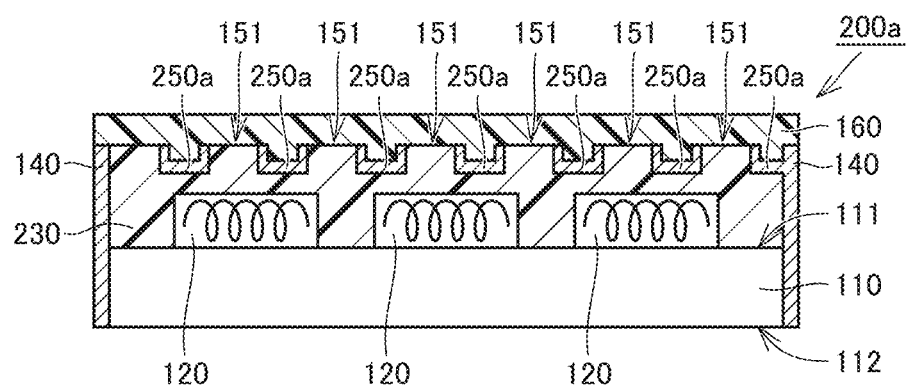
FIG. 29 is a cross sectional view of the module of FIG. 28 as viewed in a direction of arrows along a line XXIX-XXIX.

FIG. 28 is a plan view of a module in accordance with a first variation of the second exemplary embodiment. FIG. 29 is a cross sectional view of the module of FIG. 28 as viewed in a direction of arrows along a line XXIX-XXIX.

As shown in FIGS. 28 and 29, in a module 200a, a plurality of linear conductor portions 250a have the same configuration as that of the plurality of linear conductor portions 150a in module 100a in accordance with the first variation of the first exemplary embodiment shown in FIGS. 13 and 14, in a plan view.

Figure 30:
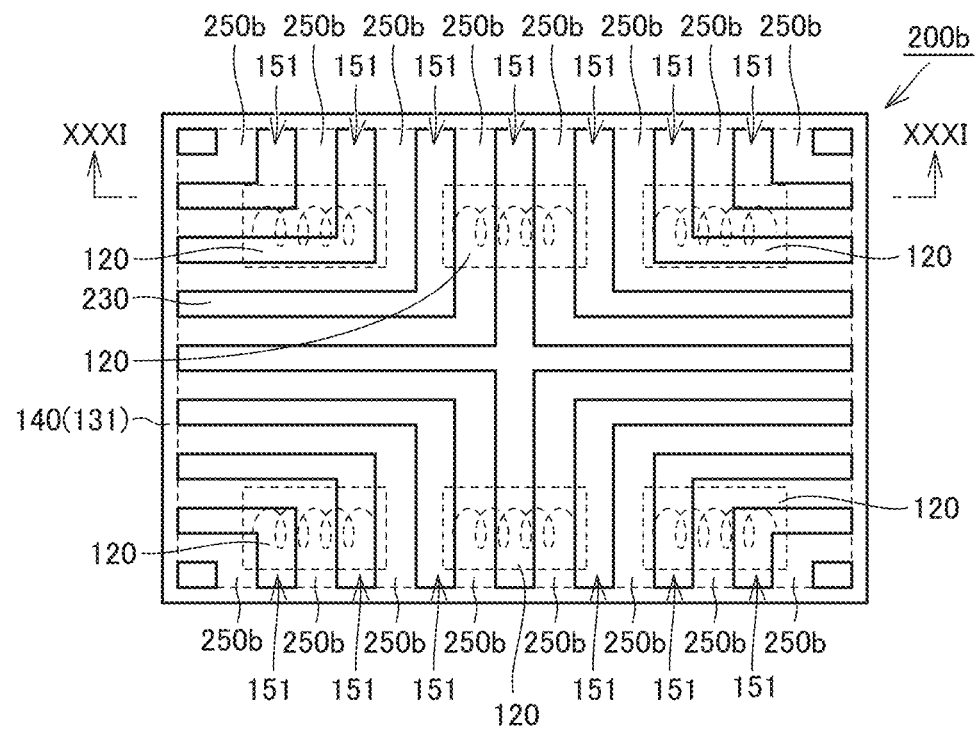
FIG. 30 is a plan view of a module in accordance with a second variation of the second exemplary embodiment.
Figure 31:
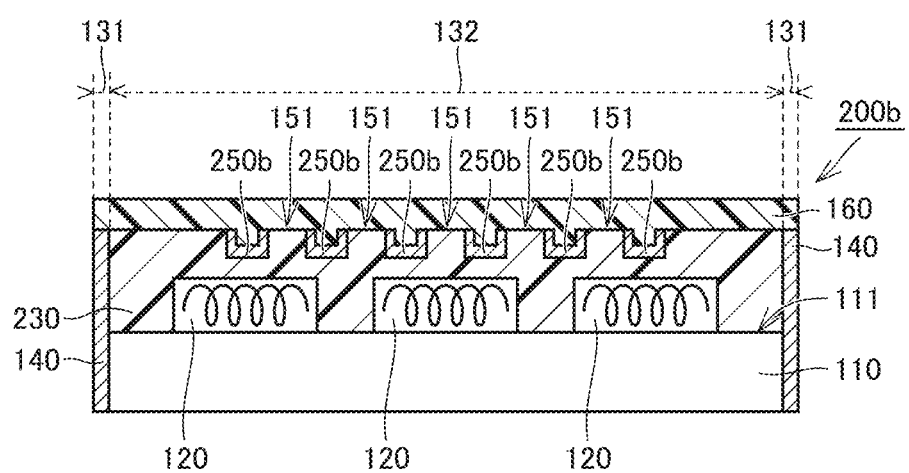
FIG. 31 is a cross sectional view of the module of FIG. 30 as viewed in a direction of arrows along a line XXXI-XXXI.

FIG. 30 is a plan view of a module in accordance with a second variation of the second exemplary embodiment. FIG. 31 is a cross sectional view of the module of FIG. 30 as viewed in a direction of arrows along a line XXXI-XXXI.

As shown in FIGS. 30 and 31, in a module 200b, a plurality of linear conductor portions 250b have the same configuration as that of the plurality of linear conductor portions 150b in module 100b in accordance with the second variation of the first exemplary embodiment shown in FIGS. 15 and 16, in a plan view.

Also in modules 200a and 200b in accordance with the first and second variations of the second exemplary embodiment, deterioration of electrical characteristics of inductor 120 is suppressed, as in modules 100a and 100b in accordance with the first and second variations of the first exemplary embodiment.

Figure 32:
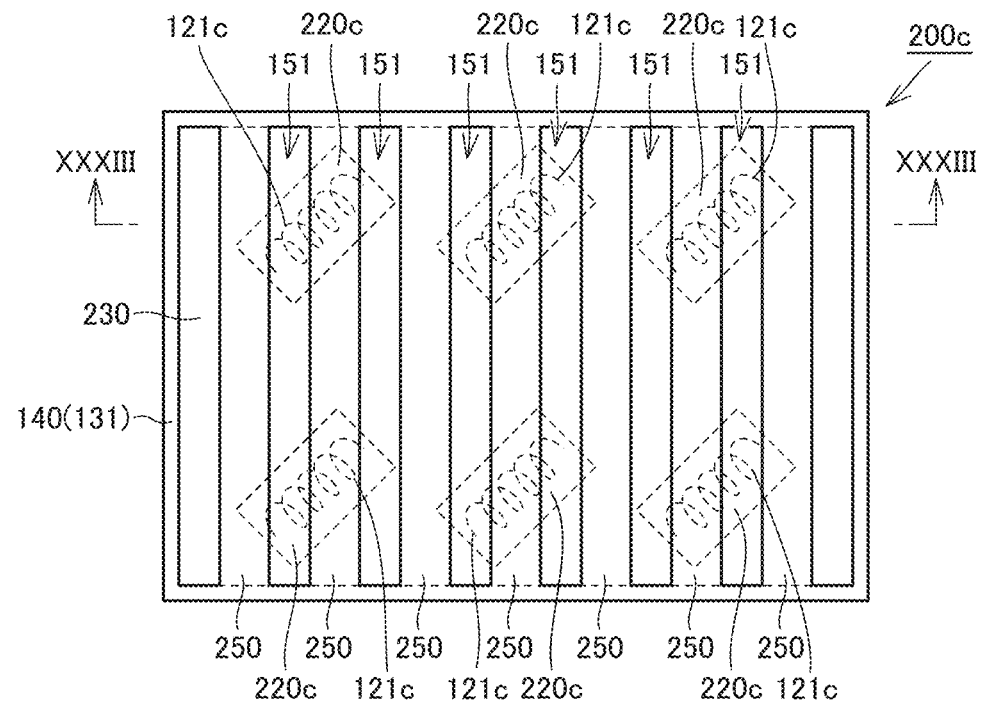
FIG. 32 is a plan view of a module in accordance with a third variation of the second exemplary embodiment.
Figure 33:
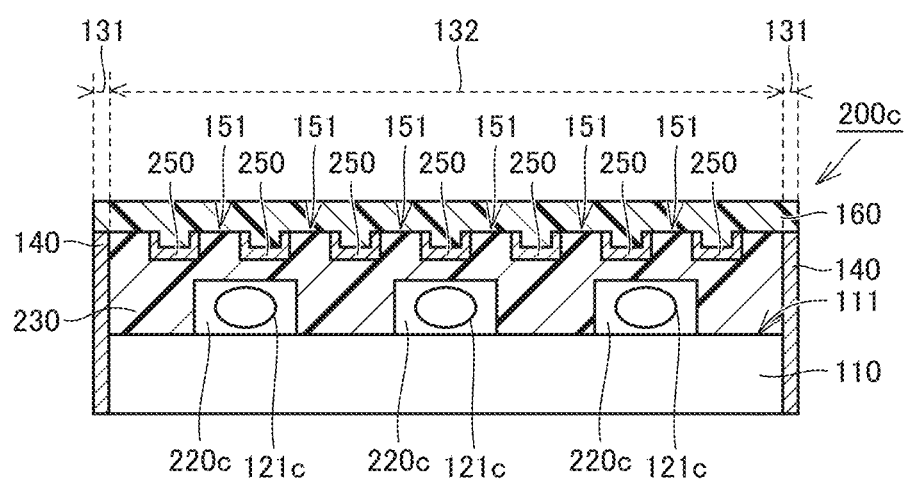
FIG. 33 is a cross sectional view of the module of FIG. 32 as viewed in a direction of arrows along a line XXXIII-XXXIII.

FIG. 32 is a plan view of a module in accordance with a third variation of the second exemplary embodiment. FIG. 33 is a cross sectional view of the module of FIG. 32 as viewed in a direction of arrows along a line XXXIII-XXXIII.

As shown in FIGS. 32 and 33, inductors 220c in a module 200c in accordance with the third variation of the second exemplary embodiment have the same configuration as that of inductors 120c in module 100c in accordance with the third variation of the first exemplary embodiment shown in FIGS. 17 and 18, in a plan view.

Figure 34:
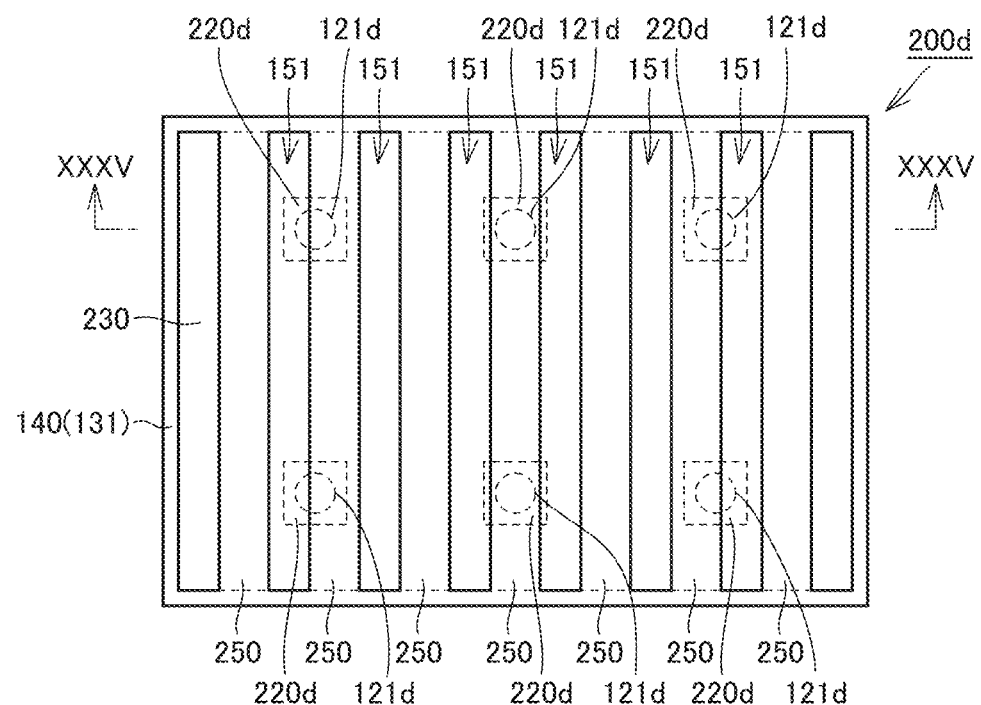
FIG. 34 is a plan view of a module in accordance with a fourth variation of the second exemplary embodiment.
Figure 35:
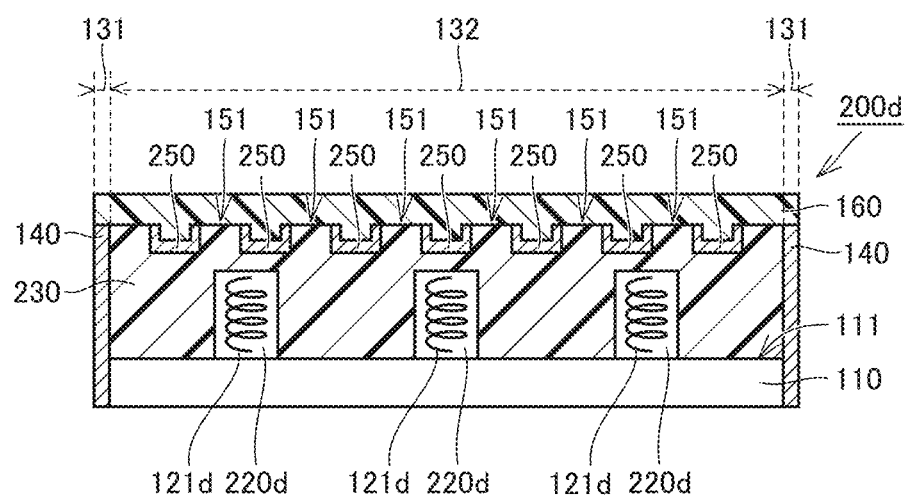
FIG. 35 is a cross sectional view of the module of FIG. 34 as viewed in a direction of arrows along a line XXXV-XXXV.

FIG. 34 is a plan view of a module in accordance with a fourth variation of the second exemplary embodiment. FIG. 35 is a cross sectional view of the module of FIG. 34 as viewed in a direction of arrows along a line XXXV-XXXV.

As shown in FIGS. 34 and 35, inductors 220d in a module 200d in accordance with the fourth variation of the second exemplary embodiment have the same configuration as that of inductors 120d in module 100d in accordance with the fourth variation of the first exemplary embodiment shown in FIGS. 19 and 20, in a plan view.

Figure 36:
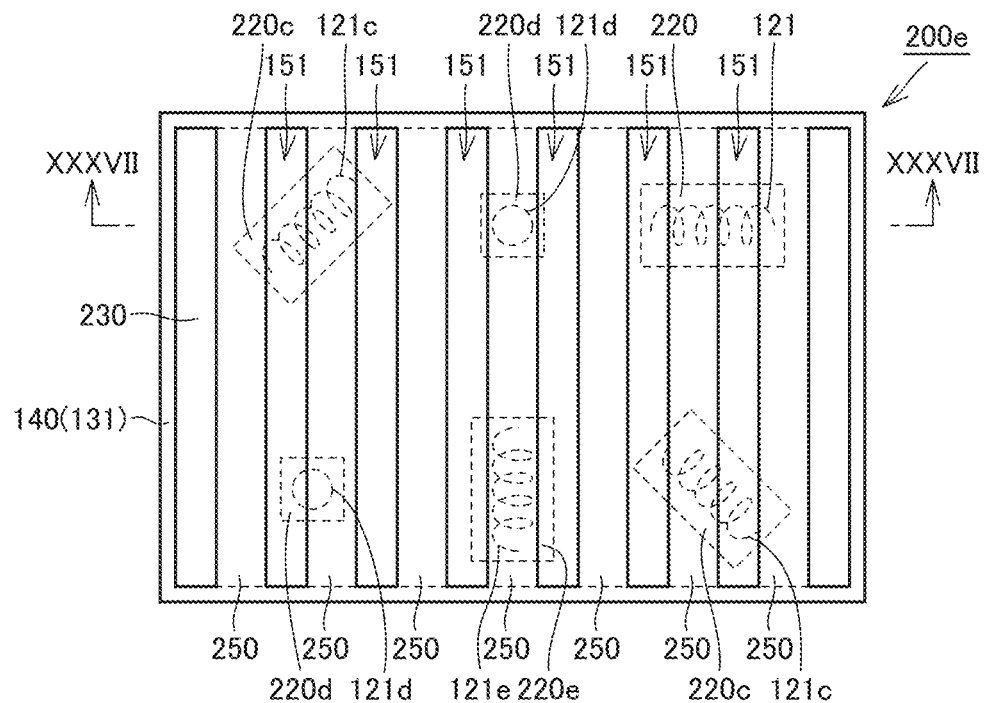
FIG. 36 is a plan view of a module in accordance with a fifth variation of the second exemplary embodiment.
Figure 37:
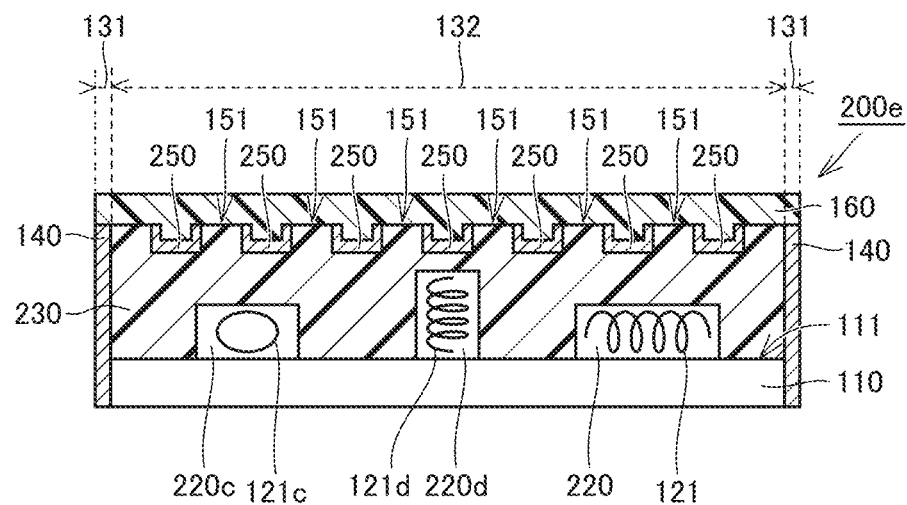
FIG. 37 is a cross sectional view of the module of FIG. 36 as viewed in a direction of arrows along a line XXXVII-XXXVII.

FIG. 36 is a plan view of a module in accordance with a fifth variation of the second exemplary embodiment. FIG. 37 is a cross sectional view of the module of FIG. 36 as viewed in a direction of arrows along a line XXXVII-XXXVII.

As shown in FIGS. 36 and 37, inductors 220, 220c, 220d, and 220e in a module 200e in accordance with the fifth variation of the second exemplary embodiment have the same configurations as those of inductors 120, 120c, 120d, and 120e in module 100e in accordance with the fifth variation of the first exemplary embodiment shown in FIGS. 21 and 22, in a plan view.

In modules 200c, 200d, and 200e in accordance with the third, fourth, and fifth variations of the second exemplary embodiment, deterioration of electrical characteristics of inductors 220c, 220d, and 220e caused by a magnetic field generated by an eddy current can be suppressed by the plurality of linear conductor portions 250 having the same configuration as that in the second exemplary embodiment.

FIG. 38 is a plan view of a module in accordance with a sixth variation of the second exemplary embodiment. As shown in FIG. 38, in a module 200f in accordance with the sixth variation of the second exemplary embodiment, a plurality of linear conductor portions 250f extend to spread radially from a central portion of module 200f, in a plan view. Thereby, the entire strength of ground conductor portion 140 and linear conductor portions 250f is improved.

Further, in the plurality of linear conductor portions 250f in the sixth variation of the second exemplary embodiment, the plurality of linear conductor portions 250f are disposed with gaps 151 therebetween, such that each of one or more inductors 120 underlies at least one of the plurality of linear conductor portions 250f, in a plan view. Thereby, deterioration of electrical characteristics of inductor 120 caused by a magnetic field generated by an eddy current is suppressed.

It is noted that in the description of the exemplary embodiments described above, the configurations that can be combined may be combined with each other.

It should also be understood that the exemplary embodiments disclosed herein are illustrative and non-restrictive in every respect.

REFERENCE SIGNS LIST 100, 100a, 100b, 100c, 100d, 100e, 200, 200a, 200b, 200c, 200d, 200e, 200f, 800, 900: module; 110: substrate; 111: main surface; 120, 120c, 120d, 120e, 220, 220c, 220d, 220e: inductor; 121, 121c, 121d, 121e: coiled conductor; 130, 230: resin sealing portion; 131: first region; 132: second region; 133: protruding strip portion; 140: ground conductor portion; 141: side surface portion; 145, 245, 845, 945: conductive layer; 150, 150a, 150b, 250, 250a, 250b, 250f: linear conductor portion; 151: gap; 160: resin surface layer portion; 234: recessed strip portion; 870: through hole; 970: opening; $B_0$, $B_1$, $B_8$, $B_9$: magnetic field; $I_0$: current; $I_1$, $I_8$, $I_9$: eddy current.

The invention claimed is:

1. A module comprising:
   a substrate having a main surface;
   one or more inductors disposed on the main surface;
   a resin sealing portion that seals the one or more inductors and covers the main surface of surface the substrate;

a ground conductor disposed on an outer peripheral side of the substrate with respect to an entirety of the one or more inductors in a plan view of the main surface of the substrate; and
a plurality of linear conductors electrically connected to the ground conductor and each disposed on the resin sealing portion,
wherein the plurality of linear conductors are arranged with gaps therebetween, such that the one or more inductors underlie at least one of the plurality of linear conductors relative to the plan view of the main surface of the substrate,
wherein at least one of the one or more inductors includes a coiled conductor having a central axis parallel to the main surface of the substrate, and
wherein each of the plurality of linear conductors has a line width in the plan view that is smaller than a length of each of the one or more inductors in a short direction thereof.

2. The module according to claim 1, wherein the gaps each have a width between the respective linear conductors that is smaller than a line width of each of the plurality of linear conductors.

3. The module according to claim 1,
wherein the ground conductor is disposed in a first region located on an outer peripheral side with respect to the entirety of the one or more inductors, on the resin sealing portion, in the plan view of the main surface of the substrate,
wherein the plurality of linear conductors cover a second region surrounded by the first region in the plan view of the main surface of the substrate,
wherein, in the plan view, the ground conductor has a rectangular frame-like outer shape along the first region, and
wherein, in the plan view, each of the plurality of linear conductors extends to connect two sides of the ground conductor that are different from each other.

4. The module according to claim 3, wherein, in the plan view of the main surface of the substrate, each of the plurality of linear conductors extends to connect two sides of the ground conductor that are opposite to each other.

5. The module according to claim 3, wherein, in the plan view of the main surface of the substrate, each of the plurality of linear conductors extends, while bending, to connect two sides of the ground conductor that are adjacent to each other.

6. The module according to claim 1,
wherein the ground conductor is disposed in a first region located on an outer peripheral side with respect to the entirety of the one or more inductors, on the resin sealing portion, in the plan view of the main surface of the substrate,
wherein the plurality of linear conductors are disposed to cover a second region surrounded by the first region in the plan view,
wherein, in the plan view, the plurality of linear conductors are disposed over an entirety of the second region by linearly extending to be parallel to each other.

7. The module according to claim 1, further comprising:
a plurality of protruding strips disposed in an upper surface of the resin sealing portion,
wherein each of the plurality of linear conductors is disposed on at least an upper end surface of each of the plurality of protruding strips.

8. The module according to claim 1, further comprising:
a plurality of recessed strips disposed in an upper surface of the resin sealing portion,
wherein each of the plurality of linear conductors is disposed on at least a bottom surface of each of the plurality of recessed strips.

9. The module according to claim 1, further comprising a resin surface layer disposed to cover at least a portion of each of the resin sealing portion and the plurality of linear conductors.

10. The module according to claim 1, wherein each of the plurality of linear conductors extends in a direction that intersects a central axis of each of the one or more inductors.

11. The module according to claim 1, wherein each of the plurality of linear conductors extends in a direction that is perpendicular to a central axis of each of the one or more inductors.

12. A module comprising:
a substrate having a main surface;
one or more inductors disposed on the main surface;
a resin disposed on the one or more inductors and that covers the main surface of the substrate;
a ground conductor disposed on an outer peripheral side of the substrate and an outer peripheral side of the resin;
a plurality of linear conductors electrically connected to the ground conductor and disposed on a top surface of the resin opposite the main surface of the substrate, with the plurality of linear conductors extending in a first direction parallel to the main surface of the substrate; and
a plurality of gaps extending into the resin and between the plurality of linear conductors, respectively
wherein at least one of the one or more inductors includes a coiled conductor having a central axis parallel to the main surface of the substrate, and
wherein each of the plurality of linear conductors has a line width in the plan view that is smaller than a length of each of the one or more inductors in a short direction thereof.

13. The module according to claim 12, wherein the one or more inductors are disposed to underlie at least one of the plurality of linear conductors relative to a plan view of the main surface of the substrate.

14. The module according to claim 12, wherein the plurality of gaps each have a width between the respective linear conductors that is smaller than a line width of each of the plurality of linear conductors.

15. The module according to claim 12,
wherein the ground conductor is disposed in a first region located on the outer peripheral side of the resin with respect to the entirety of the one or more inductors in a plan view of the main surface of the substrate,
wherein the plurality of linear conductors cover a second region surrounded by the first region in the plan view,
wherein, in the plan view, the ground conductor has a rectangular frame-like outer shape along the first region, and
wherein, in the plan view, each of the plurality of linear conductors extends to connect two sides of the ground conductor that are different from each other.

\* \* \* \* \*